United States Patent
Kang et al.

(10) Patent No.: US 11,503,239 B2
(45) Date of Patent: Nov. 15, 2022

(54) ELECTRONIC CIRCUIT FOR CONFIGURING AMPLIFYING CIRCUIT CONFIGURED TO OUTPUT VOLTAGE INCLUDING LOW NOISE

(71) Applicant: SAMSUNG ELECTRONICS CO., LTD., Suwon-si (KR)

(72) Inventors: Sunyool Kang, Hwaseong-si (KR); Yunhwan Jung, Hwaseong-si (KR); Heesung Chae, Seoul (KR); Sukki Yoon, Suwon-si (KR); Yongjun Cho, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/822,930

(22) Filed: Mar. 18, 2020

(65) Prior Publication Data

US 2020/0404208 A1 Dec. 24, 2020

(30) Foreign Application Priority Data

Jun. 21, 2019 (KR) .......................... 10-2019-0074300

(51) Int. Cl.
*H04N 5/378* (2011.01)
*G05F 1/46* (2006.01)
(Continued)

(52) U.S. Cl.
CPC ............. *H04N 5/378* (2013.01); *G05F 1/468* (2013.01); *G05F 1/561* (2013.01); *G05F 3/262* (2013.01);
(Continued)

(58) Field of Classification Search
CPC ............. G03F 3/4521; G03F 3/452115; G03F 3/45215; G03F 3/45237; G03F 3/45242; H03F 1/26
See application file for complete search history.

(56) References Cited

U.S. PATENT DOCUMENTS 5,847,600 A * 12/1998 Brooks ............... H03F 3/45188
330/253
5,936,466 A * 8/1999 Andoh ................ H03F 3/45659
330/253

(Continued)

FOREIGN PATENT DOCUMENTS

GB 2 343 574 A 5/2000
KR 10-1948057 B1 2/2019

*Primary Examiner* — Thomas J. Hiltunen
(74) *Attorney, Agent, or Firm* — Sughrue Mion, PLLC

(57) ABSTRACT

An electronic circuit is provided. The electronic circuit includes a first current generating circuit configured to output a first operating current based on a first operating voltage; and an input circuit configured to: receive a first current corresponding to a first input voltage and a second current corresponding to a second input voltage, wherein the first current and the second current are based on the first operating current; receive a third current and a fourth current that are generated based on the first operating voltage; and generate a fifth current corresponding to the second input voltage based on a second operating current. The electronic circuit is configured to generate an output voltage that is associated with a difference between the first input voltage and the second input voltage based on the second current, the fourth current and the fifth current, and the fourth current corresponds to the third current.

20 Claims, 14 Drawing Sheets

(51) Int. Cl.
    *G05F 1/56*     (2006.01)
    *G05F 3/26*     (2006.01)
    *H03F 3/45*     (2006.01)
    *H04N 5/357*     (2011.01)

(52) U.S. Cl.
    CPC ....... *H03F 3/4521* (2013.01); *H03F 3/45183* (2013.01); *H03F 3/45192* (2013.01); *H03F 3/45237* (2013.01); *H04N 5/3575* (2013.01); *H03F 2200/91* (2013.01)

(56) References Cited

U.S. PATENT DOCUMENTS

| | | | | |
|---|---|---|---|---|
| 6,118,318 | A * | 9/2000 | Fifield | H03K 3/3525 326/27 |
| 6,169,424 | B1 * | 1/2001 | Kurd | H03F 3/45237 327/53 |
| 6,323,486 | B1 | 11/2001 | Grossman et al. | |
| 6,452,429 | B1 * | 9/2002 | Lim | H03K 19/01707 327/108 |
| 6,549,049 | B1 * | 4/2003 | Hinterscher | H03K 3/3565 327/206 |
| 6,605,993 | B2 * | 8/2003 | Suzuki | H03F 3/45708 330/252 |
| 6,919,766 | B2 * | 7/2005 | Suzuki | H03F 3/45219 330/252 |
| 8,378,736 | B2 | 2/2013 | Burgener et al. | |
| 8,395,420 | B2 * | 3/2013 | Nakagawa | G11C 7/1084 327/108 |
| 8,405,747 | B2 * | 3/2013 | Mo | H04N 5/361 358/529 |
| 8,745,115 | B2 * | 6/2014 | Joseph | H04N 5/378 708/313 |
| 8,760,203 | B1 | 6/2014 | Amourah | |
| 8,922,261 | B2 * | 12/2014 | Zhang | H03K 4/00 327/137 |
| 8,928,406 | B2 * | 1/2015 | Albinet | H03F 3/45636 330/253 |
| 9,083,296 | B2 | 7/2015 | Rajaee | |
| 9,191,599 | B2 | 11/2015 | Park et al. | |
| 9,209,764 | B2 * | 12/2015 | Cho | G11C 7/06 |
| 9,274,536 | B2 | 3/2016 | Tseng | |
| 9,473,122 | B1 | 10/2016 | Shen et al. | |
| 10,044,362 | B2 * | 8/2018 | Hsieh | H03M 1/12 |
| 10,506,182 | B2 * | 12/2019 | Izuha | H04N 5/353 |
| 10,658,992 | B1 * | 5/2020 | Wang | H03F 3/45192 |
| 2012/0212657 | A1 * | 8/2012 | Mo | H04N 5/3658 348/300 |
| 2014/0055176 | A1 * | 2/2014 | Zhang | H03K 4/501 327/131 |
| 2015/0349622 | A1 | 12/2015 | Lo et al. | |
| 2017/0366771 | A1 | 12/2017 | Jung et al. | |
| 2018/0033722 | A1 | 2/2018 | Jung et al. | |

* cited by examiner

ELECTRONIC CIRCUIT FOR CONFIGURING AMPLIFYING CIRCUIT CONFIGURED TO OUTPUT VOLTAGE INCLUDING LOW NOISE

CROSS-REFERENCE TO RELATED APPLICATION

This application claims priority from Korean Patent Application No. 10-2019-0074300 filed on Jun. 21, 2019 in the Korean Intellectual Property Office, the disclosure of which is incorporated herein by reference in its entirety.

BACKGROUND

Embodiments described herein relate to an electronic circuit, and more particularly, relate to an electronic circuit for implementing an amplifying circuit.

The importance of an image sensor that is included in a camera device is increasing as a mobile device, a digital camera, etc., become popular. The image sensor senses a light by using a photodiode or the like and outputs a digital image signal by using an analog-to-digital converter (ADC). The image sensor includes a plurality of pixels to sense a light.

The ADC included in the image sensor includes electronic circuits for processing signals received from pixels. Each of the electronic circuits includes a plurality of transistors. The transistors operate based on various operating voltages, and the operations of the transistors cause a noise. The noise generated by the transistors comes from various causes.

A low-noise image sensor is needed to obtain image data of a high quality.

SUMMARY

Example embodiments provide an electronic circuit for implementing an amplifying circuit outputting a voltage including a low noise.

According to an example embodiment, an electronic circuit includes a first current generating circuit configured to output a first operating current based on a first operating voltage; and an input circuit configured to: receive a first current corresponding to a first input voltage and a second current corresponding to a second input voltage, wherein the first current and the second current are based on the first operating current; receive a third current and a fourth current that are generated based on the first operating voltage; and generate a fifth current corresponding to the second input voltage based on a second operating current. The electronic circuit is configured to generate an output voltage that is associated with a difference between the first input voltage and the second input voltage based on the second current, the fourth current and the fifth current, and the fourth current corresponds to the third current.

According to an example embodiment, an electronic circuit includes a first current generating circuit configured to output a first operating current based on an operating voltage, the first operating current including a first current and a second current; a load circuit configured to output a third current and a fourth current that corresponds to the third current based on the operating voltage; and an input circuit configured to: based on a first input voltage, conduct the first current and a fifth current that includes the first current and the third current; and based on a second input voltage, conduct the second current and output a sixth current. The electronic circuit is configured to generate an output voltage that is associated with a difference between the first input voltage and the second input voltage based on the second current, the fourth current and the sixth current.

According to an example embodiment, an electronic circuit includes a first transistor configured to conduct a first current generated based on an operating voltage and a first input voltage; a second transistor configured to conduct a second current generated based on the operating voltage and a second input voltage; a third transistor configured to conduct the first current and a third current generated based on the operating voltage and the first input voltage; and a fourth transistor configured to conduct a fourth current based on the second input voltage. The electronic circuit is configured to generate a fifth current that corresponds to the third current, and generate an output voltage that is associated with a difference between the first input voltage and the second input voltage based on the fifth current, the second current and the fourth current.

According to an example embodiment, an amplifying circuit is configured to output an output voltage based on a first input voltage and a second input voltage. The amplifying circuit comprises a first current source circuit connected between a first operating voltage node and a first node; a first transistor connected between the first node and a second node, and operated in response to the first input voltage; a second transistor connected between the second node and a third node, and operated in response to the first input voltage; a third transistor connected between the first operating voltage node and the second node, and operated in response to the second node; a fourth transistor connected between the first node and a fourth node, and operated in response to the second input voltage; a fifth transistor connected between the fourth node and the third node, and operated in response to the second input voltage; a sixth transistor connected between the first operating voltage node and the fourth node, and operated in response to the second node; and a second current source circuit connected between the third node and a second operating voltage node. The output voltage is outputted from the fourth node.

BRIEF DESCRIPTION OF THE FIGURES

The above and other objects and features will become apparent by describing in detail example embodiments thereof with reference to the accompanying drawings.

DETAILED DESCRIPTION

Below, example embodiments of the inventive concepts may be described in detail and clearly to such an extent that an ordinary one in the art easily implements the inventive concepts.

Figure 1:
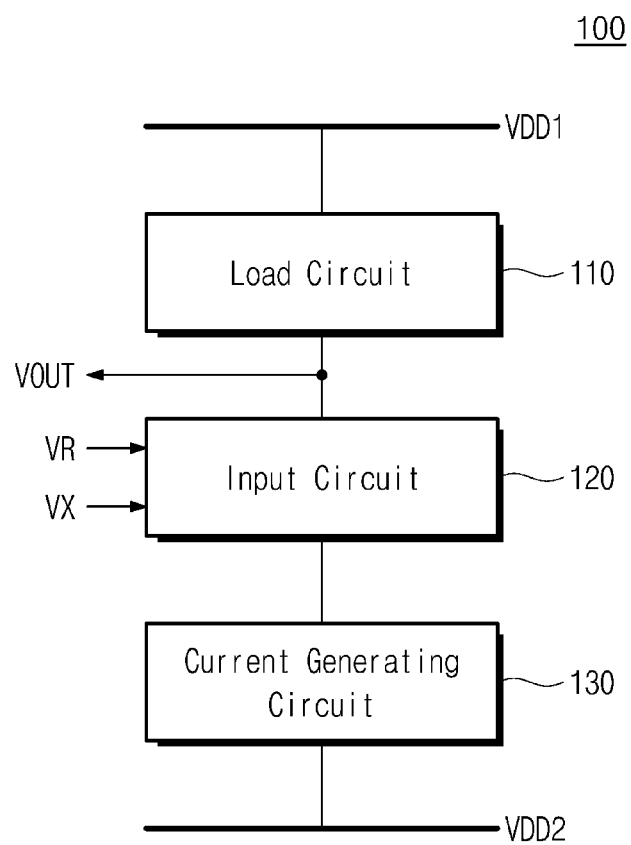
FIG. 1 is a block diagram illustrating electronic circuit for implementing an amplifying circuit according to an example embodiment.

FIG. 1 is a block diagram illustrating an electronic circuit for implementing an amplifying circuit according to an example embodiment. Referring to FIG. 1, an electronic circuit 100 may include a load circuit 110, an input circuit 120, and a current generating circuit 130.

The load circuit 110 may receive an operating voltage VDD1. For example, the operating voltage VDD1 may be generated by an electronic circuit such as a voltage generator placed inside/outside the electronic circuit 100. The load circuit 110 may output currents to the input circuit 120 based on the operating voltage VDD1.

The input circuit 120 may receive currents output from the load circuit 110. The input circuit 120 may receive voltages VR and VX from an external electronic circuit different from the electronic circuit 100. The input circuit 120 may output currents based on the voltages VR and VX. Levels of currents that are output from the input circuit 120 may be associated with levels of the voltages VR and VX.

The current generating circuit 130 may receive an operating voltage VDD2. For example, the operating voltage VDD2 may be generated by an electronic circuit such as a voltage generator placed inside/outside the electronic circuit 100. The current generating circuit 130 may generate an operating current based on the operating voltage VDD2.

The electronic circuit 100 may output a voltage VOUT to an output stage through a node between the load circuit 110 and the input circuit 120 based on the voltages VR and VX. For example, the electronic circuit 100 may output the voltage VOUT based on the currents output from the load circuit 110 and the currents output from the input circuit 120.

A level of the voltage VOUT may be associated with a difference between the levels of the voltages VR and VX. For example, the level of the voltage VOUT may have a value that is obtained by amplifying the difference between the levels of the voltages VR and VX.

The electronic circuit 100 may be adopted for operations of an electronic device. For example, the electronic circuit 100 may be included in an amplifying circuit that is adopted for an operation of an image sensor. The image sensor may detect the intensity of a light incident on the image sensor that is received from an external object. The image sensor may include an amplifying circuit such as an operational transconductance amplifier (OTA) circuit to convert the intensity of a sensed light into a digital signal.

For example, the amplifying circuit may receive a pixel voltage corresponding to the intensity of a light from a pixel array for sensing the light and may also receive a ramp voltage from a voltage generator. The electronic circuit 100 included in the amplifying circuit may be used to detect a difference between a level of the ramp voltage and a level of the pixel voltage. For example, the voltage VR may be a ramp voltage being used as a reference for comparison, and the voltage VX may be a pixel voltage. Accordingly, the voltage VOUT may have a level corresponding to the difference between the level of the ramp voltage and the level of the pixel voltage.

The operating voltages VDD1 and VDD2 may have appropriate levels for operations of the electronic circuit 100. For example, the operating voltages VDD1 and VDD2 may be associated with the voltage VOUT being an output of the electronic circuit 100. For example, a level of the operating voltage VDD1 may correspond to a maximum value of a level that the voltage VOUT is able to have, and a level of the operating voltage VDD2 may correspond to a minimum value of a level that the voltage VOUT is able to have.

For example, a designer of the electronic circuit 100 may appropriately set levels of the operating voltages VDD1 and VDD2 to satisfy various demands (e.g., a range of a level of the voltage VOUT for an operation of an electronic device including the electronic circuit 100). Below, example configurations of the electronic circuit 100 are described with reference to FIGS. 2 and 3.

Figure 2:
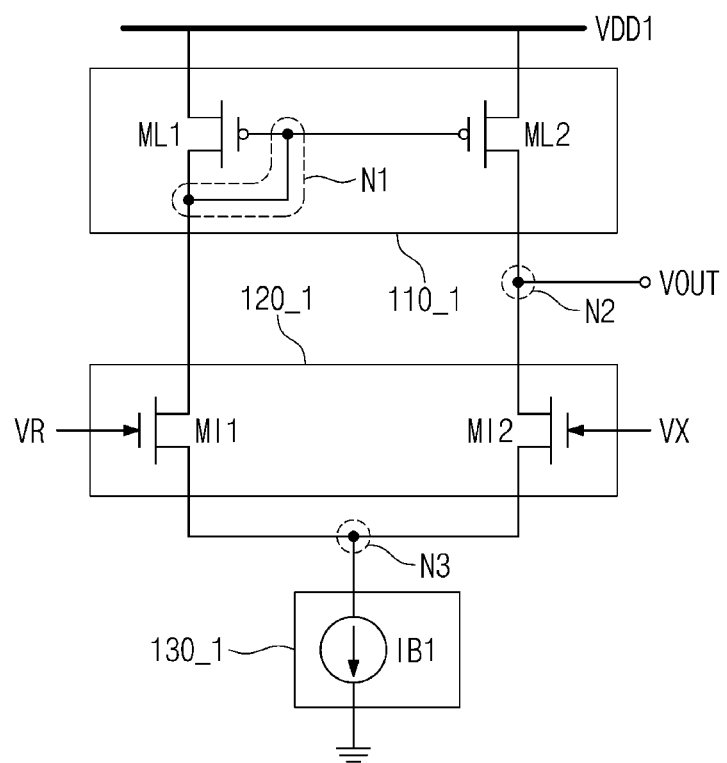
FIG. 2 is a circuit diagram illustrating configuration of an electronic circuit according to an example embodiment.

FIG. 2 is a circuit diagram illustrating configuration of an electronic circuit according to an example embodiment.

The electronic circuit 100 of FIG. 1 may include an electronic circuit 100_1 of FIG. 2. The load circuit 110 of FIG. 1 may include a load circuit 110_1 of FIG. 2, the input circuit 120 of FIG. 1 may include an input circuit 120_1 of FIG. 2, and the current generating circuit 130 of FIG. 1 may include a current generating circuit 130_1 of FIG. 2.

Referring to FIG. 2, the load circuit 110_1 may include transistors ML1 and ML2, the input circuit 120_1 may include transistors MI1 and MI2, and the current generating circuit 130_1 may include a current source circuit IB1. In the example of FIG. 2, each of the transistors ML1 and ML2 may be implemented with a PMOS transistor, and each of the transistors MI1 and MI2 may be implemented with an NMOS transistor. For example, the current source circuit IB1 may include at least one transistor.

For example, each of the transistors ML1, ML2, MIL and MI2 may include at least one of various types of transistors such as a junction transistor and a field effect transistor (FET). The example where each of the transistors ML1, ML2, MIL and MI2 is implemented with one transistor is illustrated in FIG. 2, but it may be understood that each of the transistors ML1, ML2, MI1, and MI2 may include transistors connected in series, transistors connected in parallel, or at least one of various combinations of transistors connected in series and/or in parallel.

A gate terminal of the transistor ML1 may be connected with a node N1. The operating voltage VDD1 may be received through a first end of the transistor ML1. A second end of the transistor ML1 may be connected with the node N1. A gate terminal of the transistor ML2 may be connected with the node N1. The operating voltage VDD1 may be received through a first end of the transistor ML2. A second end of the transistor ML2 may be connected with a node N2.

The voltage VR may be received through a gate terminal of the transistor MI1. The transistor MI1 may be connected between the node N1 and a node N3. The voltage VX may be received through a gate terminal of the transistor MI2. The transistor MI2 may be connected between the node N2 and the node N3. The current source circuit IB1 may be connected between the node N3 and a ground terminal.

The node N2 between the transistors ML2 and MI2 may be connected with an output terminal. The electronic circuit 100_1 may output the voltage VOUT through the output terminal connected with the node N2.

An example embodiment in which a ground voltage is adopted as the operating voltage VDD2 is described with reference to FIGS. 2 and 3. However, as described with reference to FIG. 1, it may be understood that a level of the operating voltage VDD2 may be changed variously for an operation of the electronic circuit 100_1. Example operations of the electronic circuit 100_1 will be more fully described with reference to FIG. 3.

Figure 3:
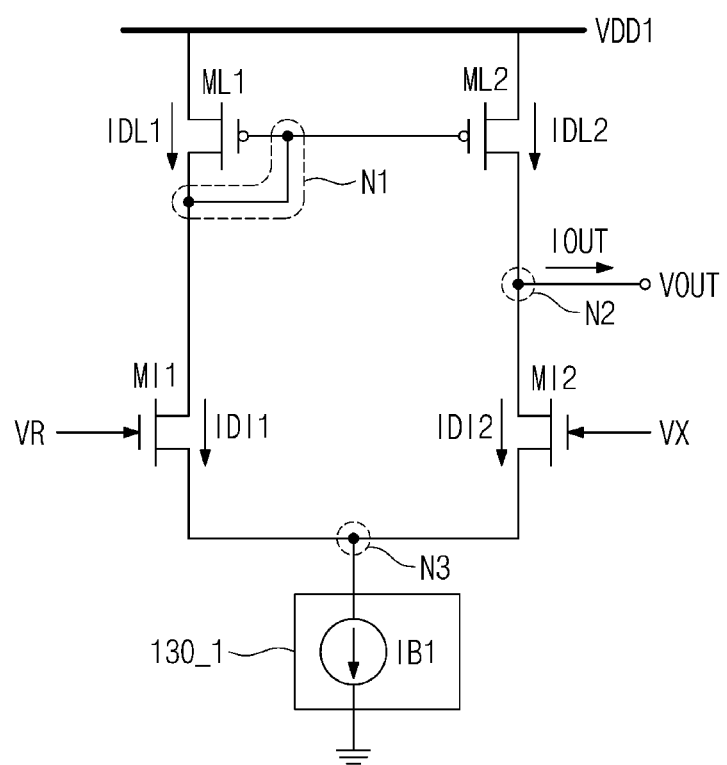
FIG. 3 is a circuit diagram illustrating operations of the electronic circuit of FIG. 2 according to an example embodiment.

FIG. 3 is a circuit diagram illustrating operations of the electronic circuit of FIG. 2 according to an example embodiment.

The transistor MI1 may receive the voltage VR through the gate terminal thereof. The transistor MI1 may allow a current IDI1 to flow from the node N1 to the node N3, based on the received voltage VR. A level of the current IDI1 may correspond to a level of the voltage VR. As the current IDI1 flows through the transistor MI1, a current IDL1 corresponding to the current IDI1 may flow through the transistor ML1 based on the operating voltage VDD1.

The transistors ML1 and ML2 may constitute a symmetrical circuit. Accordingly, based on the operating voltage VDD1, the transistor ML2 may allow a current IDL2 corresponding to the current IDL1 to flow to the node N2. Levels of the currents IDL1 and IDL2 flowing through the transistors ML1 and ML2, the gate terminals of which are connected, may correspond to each other.

Because the level of the current IDL1 is determined based on the level of the voltage VR and the current IDL2 corresponds to the current IDL1, the level of the current IDL2 may be determined based on the level of the voltage VR (or the levels of the currents IDL1 and IDI1).

The transistor MI2 may receive the voltage VX through the gate terminal thereof. Based on the voltage VX, the transistor MI2 may allow a current IDI2 to flow from the node N2 to the node N3. A level of the current IDI2 may correspond to the level of the voltage VX. For example, a sum of the level of the current IDI1 and the level of the current IDI2 may correspond to a level of the current "IB1" that is generated by the current source circuit IB1.

A level of a current IOUT may have a value that is obtained by subtracting the level of the current IDI2 from the level of the current IDL2. Because the level of the current IDL2 is associated with the level of the voltage VR and the level of the current IDI2 is associated with the level of the voltage VX, the level of the current IOUT may be associated with a difference between the level of the voltage VR and the level of the voltage VX. Accordingly, the level of the voltage VOUT that is generated based on the current IOUT may correspond to the difference between the level of the voltage VR and the level of the voltage VX.

The electronic circuit 100_1 may be designed symmetrically. For example, the electronic circuit 100_1 may be designed such that the transistors ML1 and ML2 have substantially the same transconductance "gml1" and the transistors MI1 and MI2 have substantially the same transconductance "gmi1". However, it may be understood that a configuration of the electronic circuit 100_1 may be variously changed/modified such that the transconductances of the transistors ML1 and ML2 correspond to each other and the transconductances of the transistors MI1 and MI2 correspond to each other, for the purpose of performing operations similar to the operation of the electronic circuit 100_1.

The transconductance "gml1" of the transistors ML1 and ML2 may be associated with the currents IDL1 and IDL2 flowing through the transistors ML1 and ML2. The transconductance "gmi1" of the transistors MI1 and MI2 may be associated with the currents IDI1 and IDI2 flowing through the transistors MI1 and MI2. For example, the transconductance of each of the transistors ML1, ML2, MI1, and MI2 may have a value determined by Equation 1 below.

$$gm = \sqrt{2 * \mu * C_{ox} * \frac{W}{L} * ID} \qquad [\text{Equation 1}]$$

In Equation 1, "gm" indicates a transconductance (i.e., "gml1" or "gmi1") of the transistor ML1, ML2, MI1, or MI2, "$\mu$" indicates the electron mobility, "$C_{ox}$" indicates a capacitance of a gate oxide layer included in the transistor ML1, ML2, MI1, or MI2, "W/L" indicates an aspect ratio of the transistor ML1, ML2, MI1, or MI2, and "ID" indicates a current (i.e., a current IDI1, IDI2, IDL1, or IDL2) flowing through the transistor ML1, ML2, MI1, or MI2.

Figure 4:
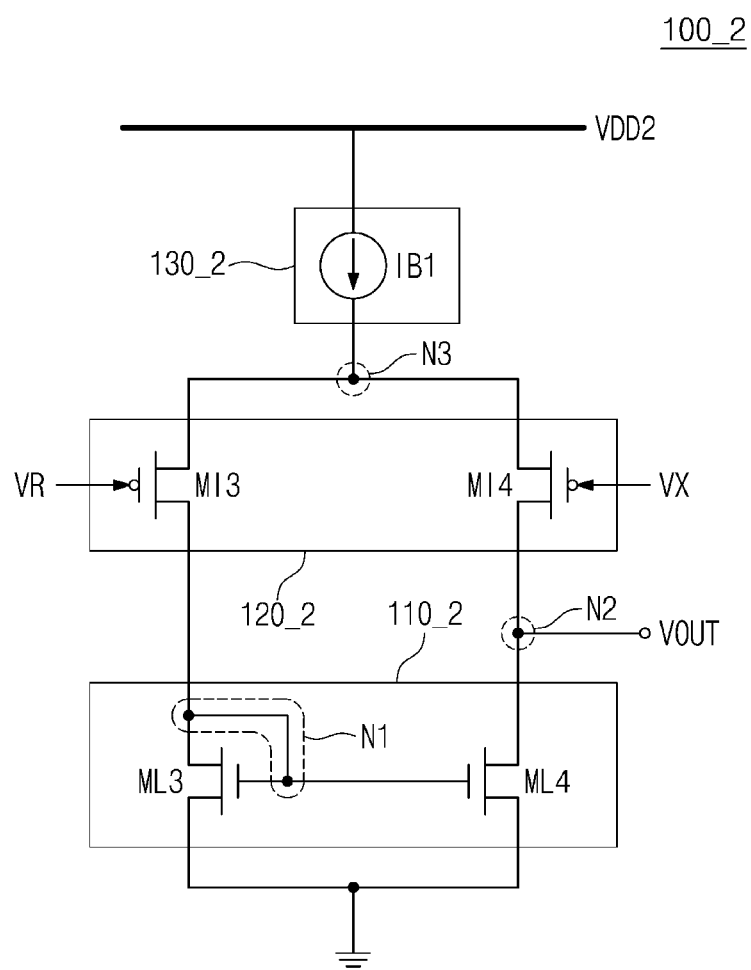
FIG. 4 is a circuit diagram illustrating configuration of an electronic circuit according to an example embodiment.

FIG. 4 is a circuit diagram illustrating configuration of an electronic circuit according to an example embodiment.

The electronic circuit 100 of FIG. 1 may include an electronic circuit 100_2 of FIG. 4. The load circuit 110 of FIG. 1 may include a load circuit 110_2 of FIG. 4, the input circuit 120 of FIG. 2 may include an input circuit 120_2 of FIG. 4, and the current generating circuit 130 of FIG. 1 may include a current generating circuit 130_2 of FIG. 4.

Referring to FIG. 4, the load circuit 110_2 may include transistors ML3 and ML4, the input circuit 120_2 may include transistors MI3 and MI4, and the current generating circuit 130_2 may include the current source circuit IB1. In the example of FIG. 4, each of the transistors MI3 and MI4 may be implemented with a PMOS transistor, and each of the transistors ML3 and MI4 may be implemented with an NMOS transistor. For example, the current source circuit IB1 may include at least one transistor.

For example, each of the transistors ML3, ML4, MI3, and MI4 may include at least one of various types of transistors such as a junction transistor and a field effect transistor. The example where each of the transistors ML3, ML4, MI3, and MI4 is implemented with one transistor is illustrated in FIG. 4, but it may be understood that each of the transistors ML3, ML4, MI3, and MI4 may include transistors connected in series, transistors connected in parallel, or at least one of various combinations of transistors connected in series and/or in parallel.

A gate terminal of the transistor ML3 may be connected with the node N1. The operating voltage VDD1 (e.g., ground voltage) may be received through a first end of the transistor ML3. A second end of the transistor ML3 may be connected with the node N1. A gate terminal of the transistor ML4 may be connected with the node N1. The operating voltage VDD1 may be received through a first end of the transistor ML4. A second end of the transistor ML4 may be connected with the node N2.

The voltage VR may be received through a gate terminal of the transistor MI3. The transistor MI3 may be connected between the node N1 and the node N3. The voltage VX may be received through a gate terminal of the transistor MI4. The transistor MI4 may be connected between the node N2 and the node N3. The current source circuit IB1 may be connected between the node N3 and a supply terminal of the operating voltage VDD2.

The node N2 between the transistors ML4 and MI4 may be connected with the output terminal. The electronic circuit 100_2 may output the voltage VOUT through the output terminal connected with the node N2. An example embodiment in which a ground voltage is adopted as the operating voltage VDD1 is described with reference to FIGS. 4 and 5. However, as described with reference to FIG. 1, it may be understood that a level of the operating voltage VDD1 may be changed variously for an operation of the electronic circuit 100_2. Example operations of the electronic circuit 100_2 will be more fully described with reference to FIG. 5.

Figure 5:
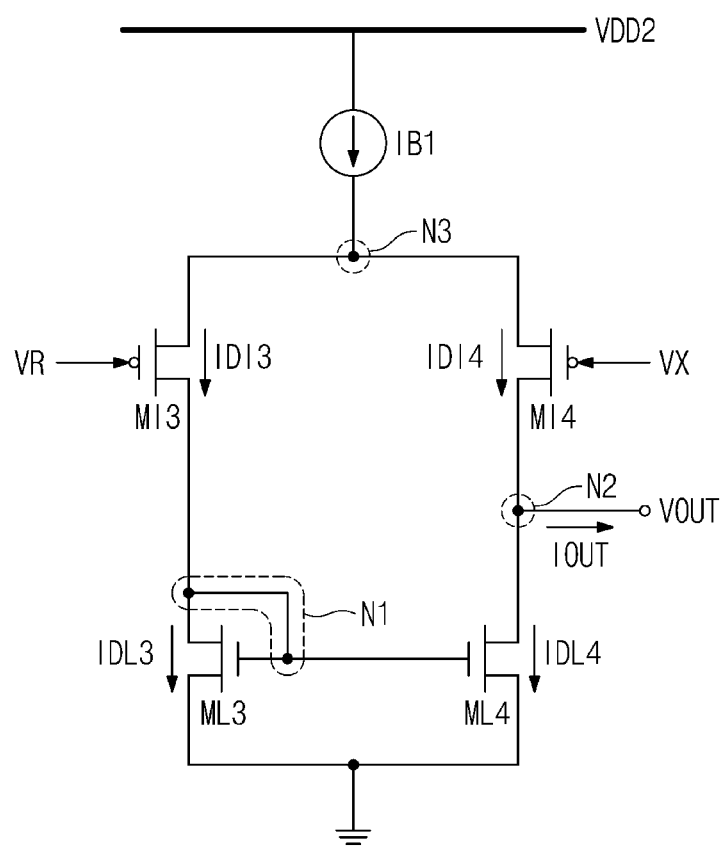
FIG. 5 is a circuit diagram illustrating operations of the electronic circuit of FIG. 4 according to an example embodiment.

FIG. 5 is a circuit diagram illustrating operations of the electronic circuit of FIG. 4 according to an example embodiment.

The transistor MI3 may receive the voltage VR through the gate terminal thereof. The transistor MI3 may allow a current IDI3 to flow from the node N3 to the node N1, based on the received voltage VR. A level of the current IDI3 may correspond to the level of the voltage VR. As the current IDI3 flows through the transistor MI3, a current IDL3 corresponding to the current IDI3 may flow through the transistor ML3 based on the operating voltage VDD2.

The transistors ML3 and ML4 may constitute a symmetrical circuit. Accordingly, based on the ground voltage, the transistor ML4 may allow a current IDL4 corresponding to the current IDL3 to flow. Levels of the currents IDL3 and IDL4 flowing through the transistors ML3 and ML4, the gate terminals of which are connected, may correspond to each other.

Because the level of the current IDL3 is determined based on the level of the voltage VR and the current IDL4 corresponds to the current IDL3, the level of the current IDL4 may be determined based on the level of the voltage VR (or the levels of the currents IDL3 and IDI3).

The transistor MI4 may receive the voltage VX through the gate terminal thereof. Based on the voltage VX, the transistor MI4 may allow a current IDI4 to flow from the node N3 to the node N2. A level of the current IDI4 may correspond to the level of the voltage VX. For example, a sum of the level of the current IDI3 and the level of the current IDI4 may correspond to a level of the current "IB1" that is generated by the current source circuit IB1.

A level of a current IOUT may have a value that is obtained by subtracting the level of the current IDL4 from the level of the current IDI4. Because the level of the current IDL4 is associated with the level of the voltage VR and the level of the current IDI4 is associated with the level of the voltage VX, the level of the current IOUT may be associated with a difference between the level of the voltage VR and the level of the voltage VX. Accordingly, the level of the voltage VOUT that is generated based on the current IOUT may correspond to the difference between the level of the voltage VR and the level of the voltage VX.

The electronic circuit 100_2 may be designed symmetrically. For example, the electronic circuit 100_2 may be designed such that the transistors ML3 and ML4 have substantially the same transconductance "gml1" and the transistors MI3 and MI4 have substantially the same transconductance "gmi1". However, it may be understood that a configuration of the electronic circuit 100_2 may be variously changed/modified such that the transconductances of the transistors ML3 and ML4 correspond to each other and the transconductances of the transistors MI3 and MI4 correspond to each other, for the purpose of performing operations similar to the operation of the electronic circuit 100_2. Example values of the transconductances "gml1" and "gmi1" are similar to those described with reference to Equation 1, and thus, additional description will be omitted to avoid redundancy.

Figure 6:
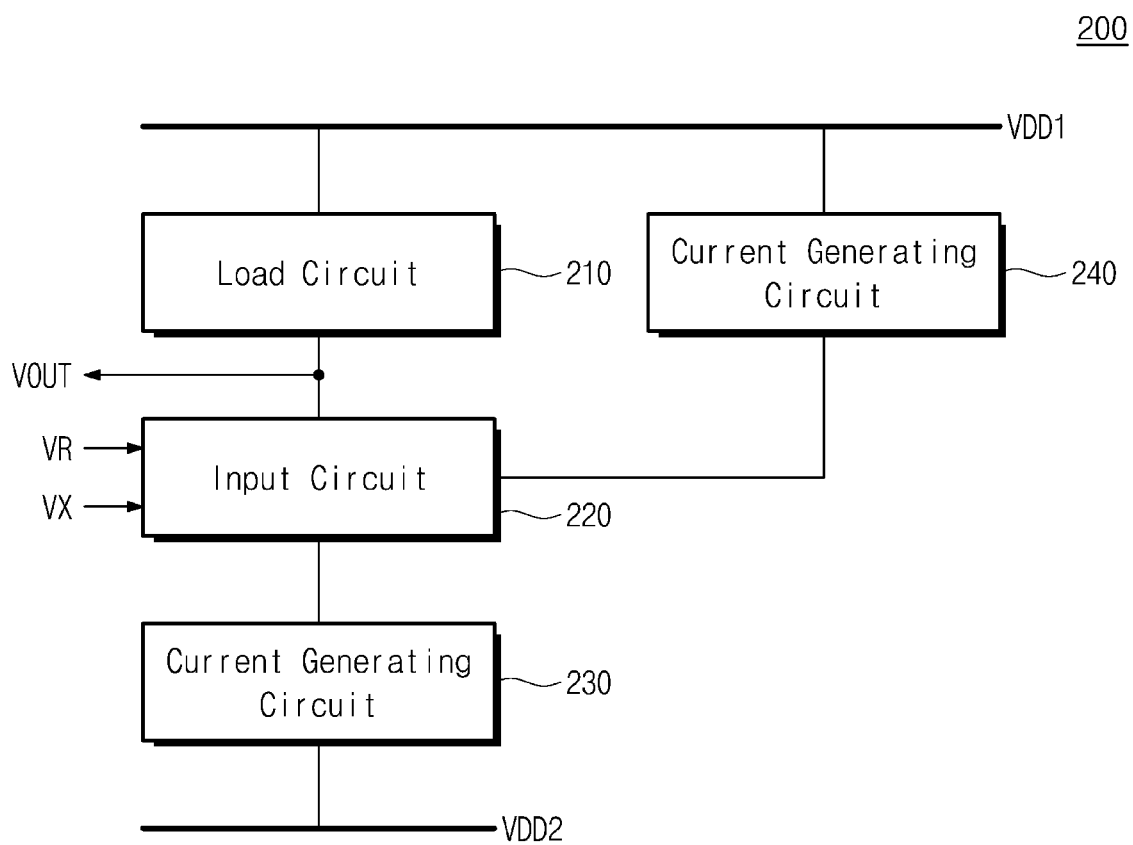
FIG. 6 is a block diagram illustrating an example electronic circuit for implementing an amplifying circuit, according to an example embodiment.

FIG. 6 is a block diagram illustrating an example electronic circuit for implementing an amplifying circuit, according to an example embodiment. Referring to FIG. 6, an electronic circuit 200 may include a load circuit 210, an input circuit 220, and current generating circuits 230 and 240.

The load circuit 210 may receive an operating voltage VDD1. For example, the operating voltage VDD1 may be generated by an electronic circuit such as a voltage generator placed inside/outside the electronic circuit 200. The load circuit 210 may output currents to the input circuit 220 based on the operating voltage VDD1.

The input circuit 220 may receive currents output from the load circuit 210. The input circuit 220 may receive the voltages VR and VX from an external electronic circuit different from the electronic circuit 200. The input circuit 220 may output currents based on the voltages VR and VX. Levels of currents that are output from the input circuit 220 may be respectively associated with levels of the voltages VR and VX.

The current generating circuit 230 may receive the operating voltage VDD2. For example, the operating voltage VDD2 may be generated by an electronic circuit such as a voltage generator placed inside/outside the electronic circuit 200. The current generating circuit 230 may generate an operating current based on the operating voltage VDD2.

The electronic circuit 200 may output the voltage VOUT through a node between the load circuit 210 and the input circuit 220 based on the voltages VR and VX. For example, the electronic circuit 200 may output the voltage VOUT based on the currents generated by the load circuit 210 and the currents generated by the input circuit 220. For example, a level of the voltage VOUT may be associated with a difference between the levels of the voltages VR and VX. For example, the level of the voltage VOUT may have a value that is obtained by amplifying the difference between the levels of the voltages VR and VX.

As described below with reference to FIGS. 13 and 14, the electronic circuit 200 may be adopted for operations of an electronic device. For example, the electronic device may be one of a personal computer (PC), a workstation, a notebook computer, and a mobile device. For example, to obtain an image of an object, the electronic device may include an image sensor configured to detect the intensity of a light.

For example, the electronic circuit 200 may be included in an amplifying circuit that is adopted for an operation of the image sensor. The image sensor may detect the intensity of a light received from an external object. The image sensor may include an amplifying circuit such as an OTA circuit to convert the intensity of a sensed light into a digital signal.

For example, the amplifying circuit may receive a pixel voltage corresponding to the intensity of a light from a pixel array for sensing the light and may receive a ramp voltage from a voltage generator. The electronic circuit 200 included in the amplifying circuit may be used to detect a difference between a level of the ramp voltage and a level of the pixel voltage. In the example of FIG. 6, the voltage VR may be a ramp voltage being a reference for comparison, and the voltage VX may be a pixel voltage. Accordingly, the voltage VOUT may have a level corresponding to the difference between the level of the ramp voltage and the level of the pixel voltage.

The current generating circuit 240 may receive the operating voltage VDD1. The current generating circuit 240 may generate an operating current based on the operating voltage VDD1. The current generating circuit 240 may output the operating current to the input circuit 220.

The operating voltages VDD1 and VDD2 may have appropriate levels for operations of the electronic circuit 200. For example, the operating voltages VDD1 and VDD2 may be associated with the voltage VOUT being an output of the electronic circuit 200. For example, a level of the operating voltage VDD1 may correspond to a maximum value that a level of the voltage VOUT is able to have, and a level of the operating voltage VDD2 may correspond to a minimum value that the level of the voltage VOUT is able to have.

For example, a designer of the electronic circuit 200 may appropriately set levels of the operating voltages VDD1 and VDD2 to satisfy various demands (e.g., a range of a level of the voltage VOUT for an operation of an electronic device including the electronic circuit 200). Below, example configurations of the electronic circuit 200 are described with reference to FIGS. 7 and 9.

Figure 7:
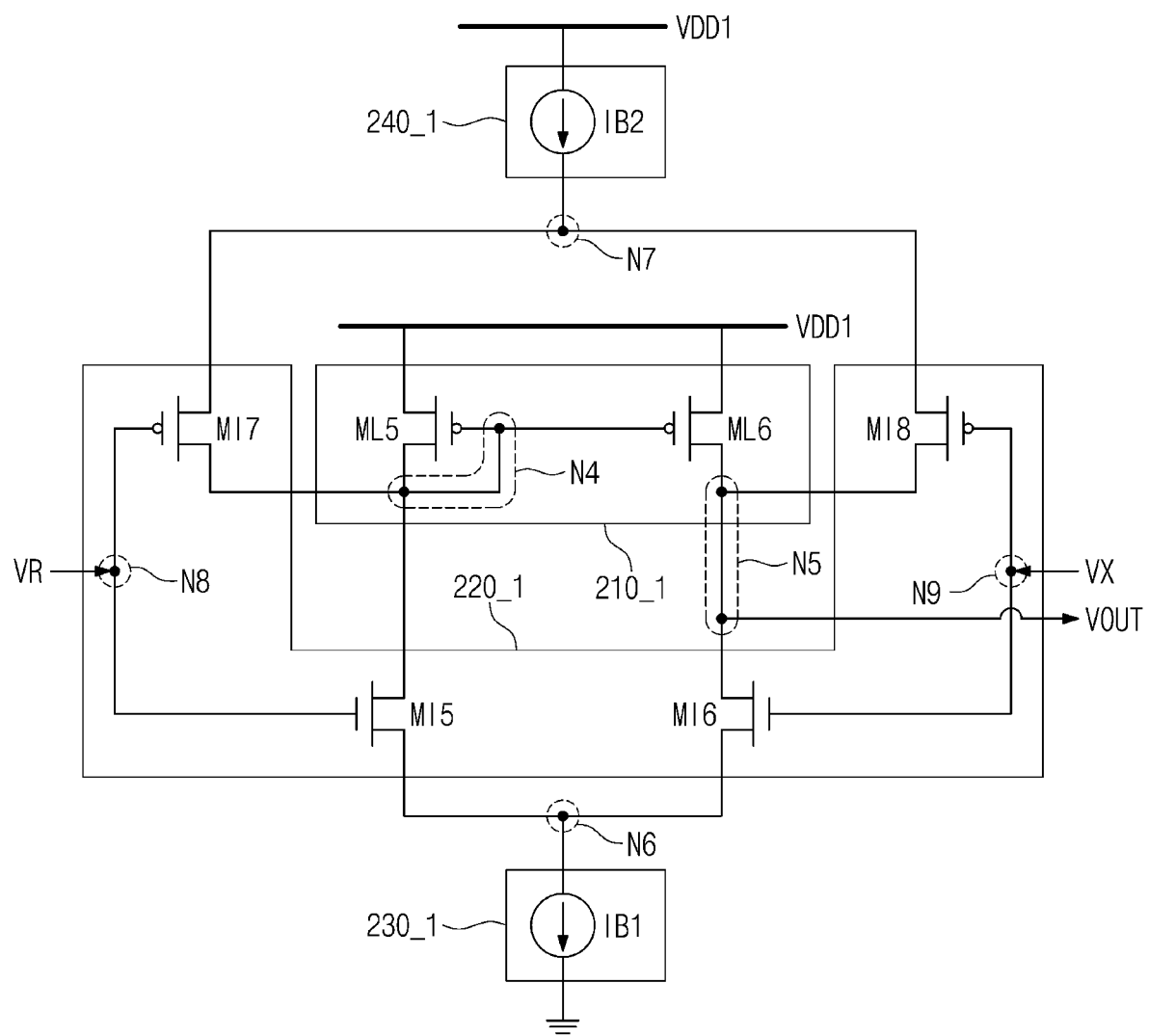
FIG. 7 is a circuit diagram illustrating configuration of an electronic circuit according to an example embodiment.

FIG. 7 is a circuit diagram illustrating configuration of an electronic circuit according to an example embodiment.

The electronic circuit 200 of FIG. 6 may include an electronic circuit 200_1 of FIG. 7. The load circuit 210 of FIG. 6 may include a load circuit 210_1 of FIG. 7, the input circuit 220 of FIG. 6 may include an input circuit 220_1 of FIG. 7, the current generating circuit 230 of FIG. 6 may include a current generating circuit 230_1 of FIG. 7, and the current generating circuit 240 of FIG. 6 may include a current generating circuit 240_1 of FIG. 7.

Referring to FIG. 7, the load circuit 210_1 may include transistors ML5 and ML6, the input circuit 220_1 may include transistors MI5, MI6, MI7 and MI8, the current generating circuit 230_1 may include a current source circuit IB1, and the current generating circuit 240_1 may include a current source circuit IB2.

In the example of FIG. 7, each of the transistors MI5 and MI6 may be implemented with an NMOS transistor, each of the transistors MI7 and MI8 may be implemented with a PMOS transistor and each of the transistors ML5 and ML6 may be implemented with a PMOS transistor. For example, each of the current source circuits IB1 and IB2 may include at least one transistor.

For example, each of the transistors ML5, ML6, and MI5, MI6, MI7 and MI8 may include at least one of various types of transistors such as a junction transistor and a field effect transistor. The example where each of the transistors ML5, ML6, MI5, MI6, MI7 and MI8 is implemented with one transistor is illustrated in FIG. 7, but it may be understood that each of the transistors ML5, ML6, MI5, MI6, MI7 and MI8 may include transistors connected in series, transistors connected in parallel, or at least one of various combinations of transistors connected in series and/or in parallel.

A gate terminal of the transistor ML5 may be connected with a node N4. The operating voltage VDD1 may be received through a first end of the transistor ML5. A second end of the transistor ML5 may be connected with the node N4. A gate terminal of the transistor ML6 may be connected with the node N4. The operating voltage VDD1 may be received through a first end of the transistor ML6. A second end of the transistor ML6 may be connected with a node N5.

The electronic circuit 200_1 may receive the voltage VR through a node N8. The voltage VR may be received through a gate terminal of the transistor MI5. The transistor MI5 may be connected between the node N4 and a node N6. The voltage VR may be received through a gate terminal of the transistor MI7. The transistor MI7 may be connected between a node N7 and the node N4.

The electronic circuit 200_1 may receive the voltage VX through a node N9. The voltage VX may be received through a gate terminal of the transistor MI6. The transistor MI6 may be connected between the node N5 and the node N6. The voltage VX may be received through a gate terminal of the transistor MI8. The transistor MI8 may be connected between the node N5 and the node N7.

The current source circuit IB1 may be connected between the node N6 and the ground terminal. The current source circuit IB2 may be connected between a supply terminal of the voltage VDD1 and the node N7. The node N5 between the transistors ML6 and MI6 may be connected with the output terminal. The electronic circuit 200_1 may output the voltage VOUT through the output terminal connected with the node N5.

An example embodiment in which a ground voltage is adopted as the operating voltage VDD2 is described with reference to FIGS. 7 and 8. However, as described with reference to FIG. 6, it may be understood that a level of the operating voltage VDD2 may be changed variously for an operation of the electronic circuit 200_1. Example operations of the electronic circuit 200_1 are more fully described below with reference to FIG. 8.

Figure 8:
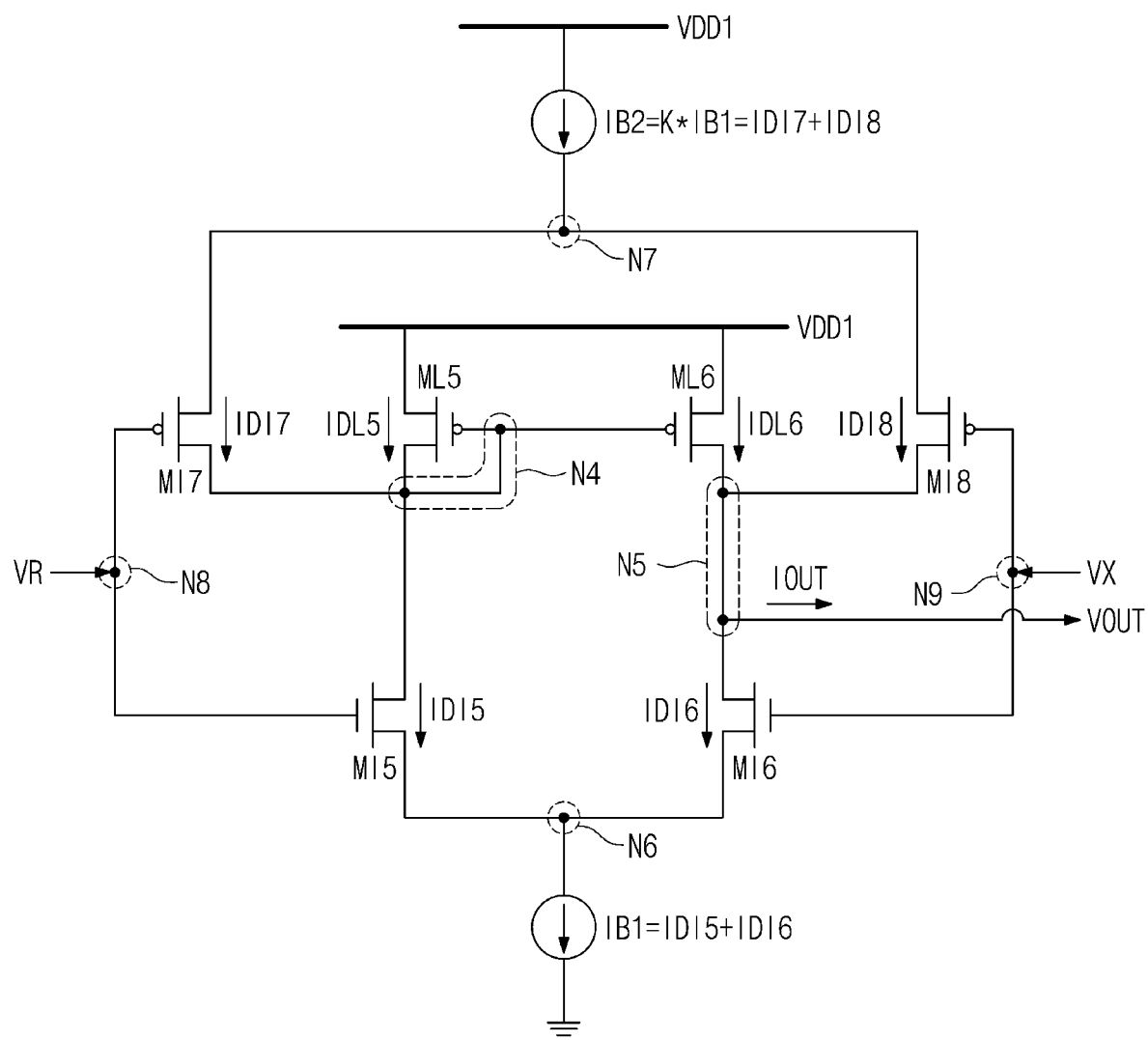
FIG. 8 is a circuit diagram illustrating operations of an electronic circuit according to an example embodiment.

FIG. 8 is a circuit diagram illustrating operations of the electronic circuit of FIG. 7 according to an example embodiment.

The transistors MI5 and MI7 may receive the voltage VR through the gate terminals thereof, respectively. Based on the voltage VR, the transistor MI5 may allow a current IDI5 to flow from the node N4 to the node N6, and the transistor MI7 may allow a current IDI7 to flow from the node N7 to the node N4.

For example, levels of the currents IDI5 and IDI7 may correspond to the level of the voltage VR. As the currents IDI5 and IDI7 flow through the transistors MI5 and MI7, respectively, the transistor ML5 may allow a current IDL5 to flow to the node N4, based on the operating voltage VDD1. A level of the current IDL5 may be associated with levels of the currents IDI5 and IDI7.

The transistors ML5 and ML6 may constitute a symmetrical circuit. Based on the operating voltage VDD1, the transistor ML6 may allow a current IDL6 corresponding to the current IDL5 to flow to the node N5. For example, levels of the currents IDL5 and IDL6 flowing through the transistors ML5 and ML6, the gate terminals of which are connected, may correspond to each other.

Because the level of the current IDL5 is determined based on the level of the voltage VR and the current IDL6 corresponds to the current IDL5, the level of the current IDL6 may be determined based on the level of the voltage VR (or the levels of the currents IDL5 and IDI5).

The transistors MI6 and MI8 may receive the voltage VX through the gate terminals thereof, respectively. Based on the voltage VX, the transistor MI6 may conduct a current IDI6 to the node N6, and the transistor MI8 may conduct a current IDI8 from the node N7 to the node N5. For example, a level of each of the currents IDI6 and IDI8 may correspond to the level of the voltage VX.

A level of the current IOUT may have a value that is determined based on the levels of the currents IDL6, IDI6, and IDI8. For example, the level of the current IOUT may be obtained by subtracting the level of the current IDI6 from a sum of the levels of the currents IDL6 and IDI8. Because the level of the current IDL6 is associated with the level of the voltage VR and the level of the currents IDI6 and IDI8 is associated with the level of the voltage VX, the level of the current IOUT may be associated with the level of the voltage VR and the level of the voltage VX. For example, the level of the current IOUT may be associated with a difference between the level of the voltage VR and the level of the voltage VX. Accordingly, the level of the voltage VOUT that is generated based on the current IOUT may correspond to the difference between the level of the voltage VR and the level of the voltage VX.

For an operation of the electronic circuit 200_1, the electronic circuit 200_1 may be designed symmetrically. For example, the electronic circuit 200_1 may be designed such that the transistors ML5 and ML6 have substantially the same transconductance "gml2", the transistors MI5 and MI6 have substantially the same transconductance "gmi2", and the transistors MI7 and MI8 have substantially the same transconductance "gmi3".

However, it may be understood that a configuration of the electronic circuit 200_1 may be variously changed/modified such that the transconductances of the transistors ML5 and ML6 correspond to each other and the transconductances of the transistors MI5, MI6, MI7 and MI8 correspond to each other, for the purpose of performing operations similar to the operation of the electronic circuit 200_1.

The transconductance "gml2" of the transistors ML5 and ML6 may be associated with the currents IDL5 and IDL6 flowing through the transistors ML5 and ML6. The transconductance "gmi2" of the transistors MI5 and MI6 may be associated with the currents IDI5 and IDI6 flowing through the transistors MI5 and MI6. The transconductance "gmi3" of the transistors MI7 and MI8 may be associated with the currents IDI7 and IDI8 flowing through the transistors MI7 and MI8. For example, the transconductance of each of the transistors ML5, ML6, MI5, MI6, MI7 and MI8 may have a value determined by Equation 1 above.

However, in Equation 1, "gm" indicates a transconductance (i.e., "gml2", "gmi2", or "gmi3") of one of the transistors of ML5, ML6, MI5, MI6, MI7 and MI8, "μ" indicates the electron mobility, "$C_{ox}$" indicates a capacitance of a gate oxide layer included in one of the transistors ML5, ML6, MI5, MI6, MI7 and MI8, "W/L" indicates an aspect ratio of one of the transistors ML5, ML6, MI5, MI6, MI7 and MI8, and "ID" indicates one of the currents IDI5, IDI6, IDL5, IDL6, IDI7 and IDI8 flowing through one of the transistors ML5, ML6, MI5, MI6, MI7 and MI8.

A sum of the level of the current IDI5 and the level of the current IDI6 may correspond to a level of the current "IB1" that is generated by the current source circuit IB1. A sum of the currents IDI7 and IDI8 flowing through the transistors MI7 and MI8 of the input circuit 220_1 and the currents IDL5 and IDL6 flowing through the transistors ML5 and ML6 of the load circuit 210_1 may correspond to a current of the current source circuit IB1. A sum of the level of the current IDI7 and the level of the current IDI8 may correspond to a level "IB2" of a current that is generated by the current source circuit IB2.

The sum of the levels of the currents IDI5 and IDI6 may be maintained by the current "IB1" generated by the current source circuit IB1. The sum of the levels of the currents IDI7 and IDI8 may be maintained by the current "IB2" generated by the current source circuit IB2.

Because a sum of the current IDI7 and the current IDL5 corresponds to the current IDI5 and a sum of the current IDL6 and the current IDI8 corresponds to the current IDI6, a maximum value of the current "IB2" of the current source circuit IB2 (corresponding to the sum of the current IDI7 and the current IDI8) may be a value of the current "IB1" of the current source circuit IB1 (corresponding to the sum of the current IDI5 and the current IDI6).

Accordingly, the value of the current "IB2" of the current source circuit IB2 may be expressed in the form of "K*IB1" (here, 0≤K≤1, K being a real number). For example, a designer may appropriately determine "K" in consideration of an auto zeroing operation of the electronic circuit 200_1. For example, "K" may be set to a real number of 0.7 to 0.9.

Figure 9:
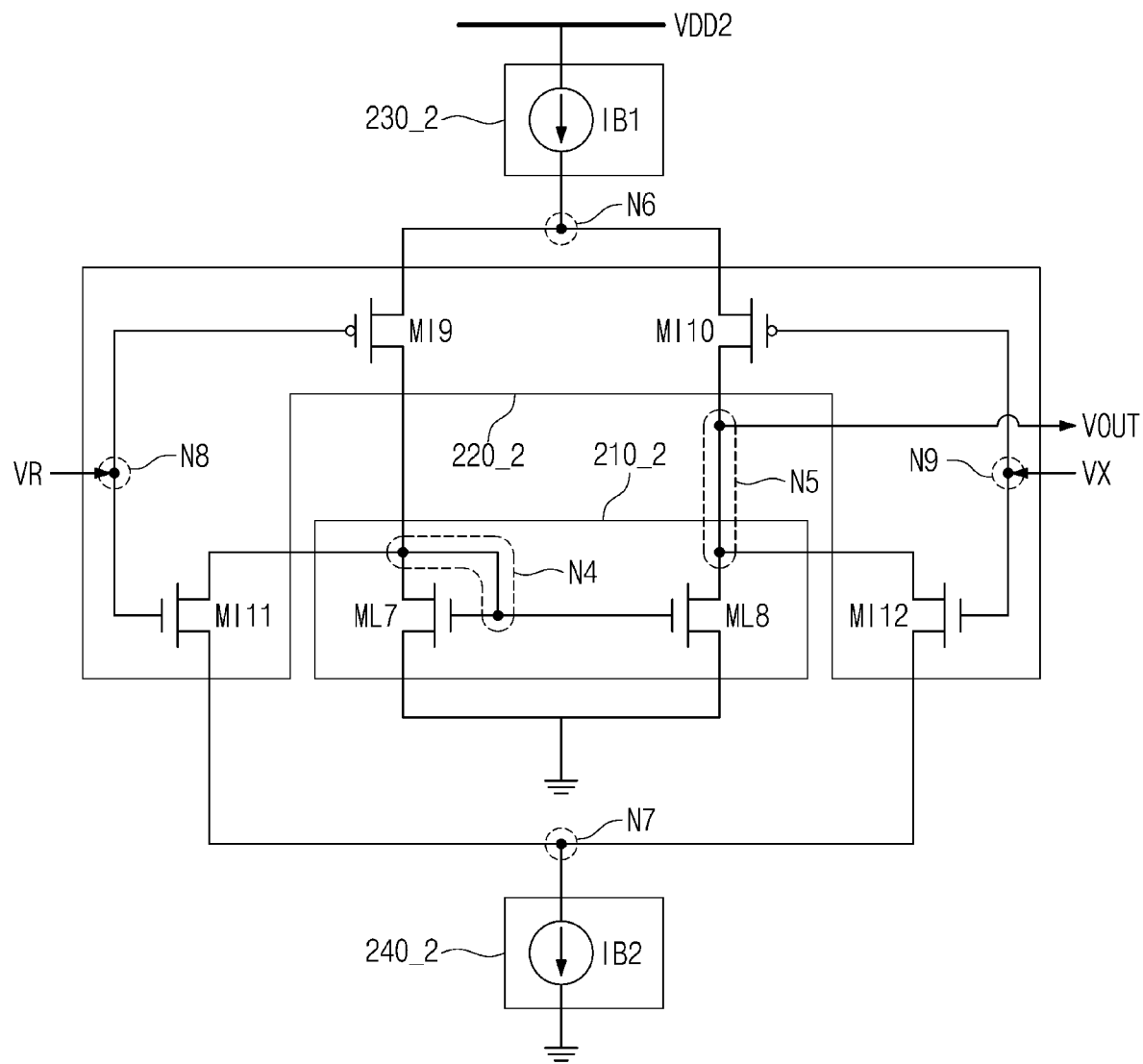
FIG. 9 is a circuit diagram illustrating configuration of an electronic circuit according to an example embodiment.

FIG. 9 is a circuit diagram illustrating configuration of an electronic circuit according to an example embodiment.

The electronic circuit 200 of FIG. 6 may include an electronic circuit 200_2 of FIG. 9. The load circuit 210 of FIG. 6 may include a load circuit 210_2 of FIG. 9, the input circuit 220 of FIG. 6 may include an input circuit 220_2 of FIG. 9, the current generating circuit 230 of FIG. 6 may include a current generating circuit 230_2 of FIG. 9, and the current generating circuit 240 of FIG. 6 may include a current generating circuit 240_2 of FIG. 9.

Referring to FIG. 9, the load circuit 210_2 may include transistors ML7 and ML8, the input circuit 220_2 may include transistors MI9, MI10, MI11 and MI12, the current generating circuit 230_2 may include the current source circuit IB1, and the current generating circuit 240_2 may include the current source circuit IB2.

In the example of FIG. 9, each of the transistors ML7, ML8, MI11, and MI12 may be implemented with an NMOS transistor, and each of the transistors MI9 and MI10 may be implemented with a PMOS transistor. For example, each of the current source circuits IB1 and IB2 may include at least one transistor.

For example, each of the transistors ML7, ML8, MI9, MI10, MI11 and MI12 may include at least one of various types of transistors such as a junction transistor and a field effect transistor. The example where each of the transistors ML7, ML8, MI9, MI10, MI11 and MI12 is implemented with one transistor is illustrated in FIG. 9, but it may be understood that each of the transistors ML7, ML8, MI9, MI10, MI11 and MI12 may include transistors connected in series, transistors connected in parallel, or at least one of various combinations of transistors connected in series and/or in parallel.

A gate terminal of the transistor ML7 may be connected with the node N4. A ground voltage may be received through a first end of the transistor ML7. A second end of the transistor ML7 may be connected with the node N4. A gate terminal of the transistor ML8 may be connected with the node N4. The ground voltage may be received through a first end of the transistor ML8. A second end of the transistor ML8 may be connected with the node N5.

The electronic circuit 200_2 may receive the voltage VR through the node N8. The voltage VR may be received through a gate terminal of the transistor MI9. The transistor MI9 may be connected between the node N4 and the node N6. The voltage VR may be received through a gate terminal of the transistor MI11. The transistor MI11 may be connected between the node N4 and the node N7.

The electronic circuit 200_2 may receive the voltage VX through the node N9. The voltage VX may be received through a gate terminal of the transistor MI10. The transistor MI10 may be connected between the node N5 and the node N6. The voltage VX may be received through a gate terminal of the transistor MI12. The transistor MI12 may be connected between the node N5 and the node N7.

The current source circuit IB1 may be connected between the operating voltage VDD2 and the node N6. The current source circuit IB2 may be connected between the node N7 and the ground terminal. The node N5 between the transistors ML8 and MI10 may be connected with the output terminal. The electronic circuit 200_2 may output the voltage VOUT through the output terminal connected with the node N5.

An example embodiment in which a ground voltage is adopted as the operating voltage VDD1 is described with reference to FIGS. 9 and 10. However, as described above with reference to FIG. 6, it may be understood that a level of the operating voltage VDD1 may be changed variously for an operation of the electronic circuit 200_2. Example operations of the electronic circuit 200_2 will be more fully described with reference to FIG. 10.

Figure 10:
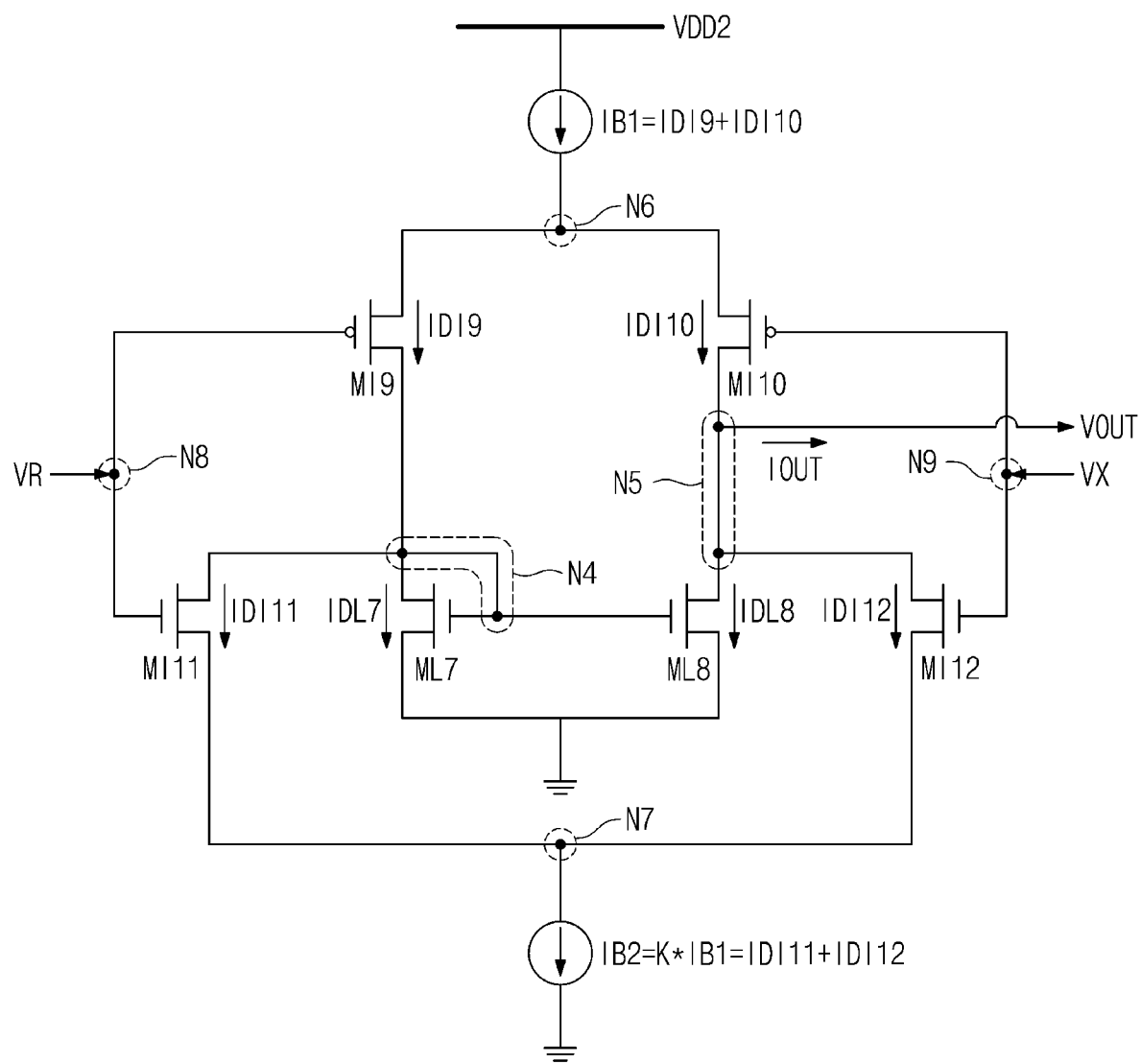
FIG. 10 is a circuit diagram illustrating operations of the electronic circuit of FIG. 9 according to an example embodiment.

FIG. 10 is a circuit diagram illustrating operations of the electronic circuit of FIG. 9 according to an example embodiment.

The transistors MI9 and MI11 may receive the voltage VR through the gate terminals thereof, respectively. Based on the voltage VR, the transistor MI9 may allow a current IDI9 to flow from the node N6 to the node N4, and the transistor MI11 may allow a current IDI11 to flow from the node N4 to the node N7.

For example, levels of the currents IDI9 and IDI11 may correspond to the level of the voltage VR. As the currents IDI9 and IDI11 flow through the transistors MI9 and MI11, respectively, the transistor ML7 may allow a current IDL7 to flow from the node N4 to the ground terminal, based on the operating voltage VDD2. A level of the current IDL7 may be associated with levels of the currents IDI9 and IDI11.

The transistors ML7 and ML8 may constitute a symmetrical circuit. Based on the ground voltage, the transistor ML8 may allow a current IDL8 corresponding to the current IDL7 to flow from the node N5 to the ground terminal. For example, levels of the currents IDL7 and IDL8 flowing through the transistors ML7 and ML8, the gate terminals of which are connected, may correspond to each other.

Because the level of the current IDL7 is determined based on the level of the voltage VR and the current IDL8 corresponds to the current IDL7, the level of the current IDL8 may be determined based on the level of the voltage VR (or the levels of the currents IDL7 and IDI9).

The transistors MI10 and MI12 may receive the voltage VX through the gate terminals thereof, respectively. Based on the voltage VX, the transistor MI10 may allow a current IDI10 to flow from the node N6 to the node N5, and the transistor MI12 may allow a current IDI12 to flow from the node N5 to the node N7. For example, a level of each of the currents IDI10 and IDI12 may correspond to the level of the voltage VX.

A level of the current IOUT may have a value that is determined based on the levels of the currents IDI10, IDL8, and IDI12. For example, the level of the current IOUT may be obtained by subtracting a sum of the levels of the currents IDL8 and IDI12 from the level of the current IDI10. Because the level of the current IDL8 is associated with the level of the voltage VR and the level of the currents IDI10 and IDI12 is associated with the level of the voltage VX, the level of the current IOUT may be associated with the level of the voltage VR and the level of the voltage VX. For example, the level of the current IOUT may be associated with a difference between the level of the voltage VR and the level of the voltage VX. Accordingly, the level of the voltage VOUT that is generated based on the current IOUT may correspond to the difference between the level of the voltage VR and the level of the voltage VX.

For an operation of the electronic circuit 200_2, the electronic circuit 200_2 may be designed symmetrically. For example, the electronic circuit 200_2 may be designed such that the transistors ML7 and ML8 have substantially the same transconductance "gml2", the transistors MI9 and MI10 have substantially the same transconductance "gmi2", and the transistors MI11 and MI12 have substantially the same transconductance "gmi3".

However, it may be understood that a configuration of the electronic circuit 200_2 may be variously changed/modified such that the transconductances of the transistors ML7 and ML8 correspond to each other and the transconductances of the transistors MI9, MI10, MI11 and MI12 correspond to each other, for the purpose of performing operations similar to the operation of the electronic circuit 200_2.

The transconductance "gml2" of the transistors ML7 and ML8 may be associated with the currents IDL7 and IDL8 flowing through the transistors ML7 and ML8. The transconductance "gmi2" of the transistors MI9 and MI10 may be associated with the currents IDI9 and IDI10 flowing through the transistors MI9 and MI10. The transconductance "gmi3" of the transistors MI11 and MI12 may be associated with the currents IDI11 and IDI12 flowing through the transistors MI11 and MI12. For example, the transconductance of each of the transistors ML7, ML8, MI9, MI10, MI11 and MI12 may have a value determined by Equation 1 above.

However, in Equation 1, "gm" indicates a transconductance (i.e., "gml2", "gmi2", or "gmi3") of one of the transistors of ML7, ML8, MI9, MI10, MI11 and MI12, "μ" indicates the electron mobility, "$C_{ox}$" indicates a capacitance of a gate oxide layer included in one of the transistors ML7, ML8, MI9, MI10, MI11 and MI12, "W/L" indicates an aspect ratio of one of the transistors ML7, ML8, MI9, MI10, MI11 and to MI12, and "ID" indicates one of the currents IDI7, IDI8, IDL9, IDL10, IDL11 or to IDL12 flowing through one of the transistors ML7, ML8, MI9, MI10, MI11 and MI12.

A sum of the level of the current IDI9 and the level of the current IDI10 may correspond to a level of the current "IB1" that is generated by the current source circuit IB1. A sum of the currents IDI11 and IDI12 flowing through the transistors MI11 and MI12 of the input circuit 220_1 and the currents IDL7 and IDL8 flowing through the transistors ML7 and ML8 of the load circuit 210_1 may correspond to a current of the current source circuit IB1. A sum of the level of the current IDI11 and the level of the current IDI12 may correspond to a level of the current "IB2" that is generated by the current source circuit IB2.

The sum of the levels of the currents IDI9 and IDI10 may be maintained by the current "IB1" generated by the current source circuit IB1. The sum of the levels of the currents IDI11 and IDI12 may be maintained by the current "IB2" generated by the current source circuit IB2.

Because a sum of the current IDI11 and the current IDL7 corresponds to the current IDI9 and a sum of the current IDI12 and the current IDL8 corresponds to the current IDI10, a maximum value of the current "IB2" of the current source circuit IB2 (corresponding to the sum of the current IDI11 and the current IDI2) may be a value of the current "IB1" of the current source circuit IB1 (corresponding to the sum of the current IDI9 and the current IDI10).

Accordingly, the value of the current "IB2" of the current source circuit IB2 may be expressed in the form of "K*IB1" (here, 0≤K≤1, K being a real number). For example, a designer may appropriately determine "K" in consideration of an auto zeroing operation of the electronic circuit 200_2. For example, "K" may be set to a real number of 0.7 to 0.9.

Figure 11:
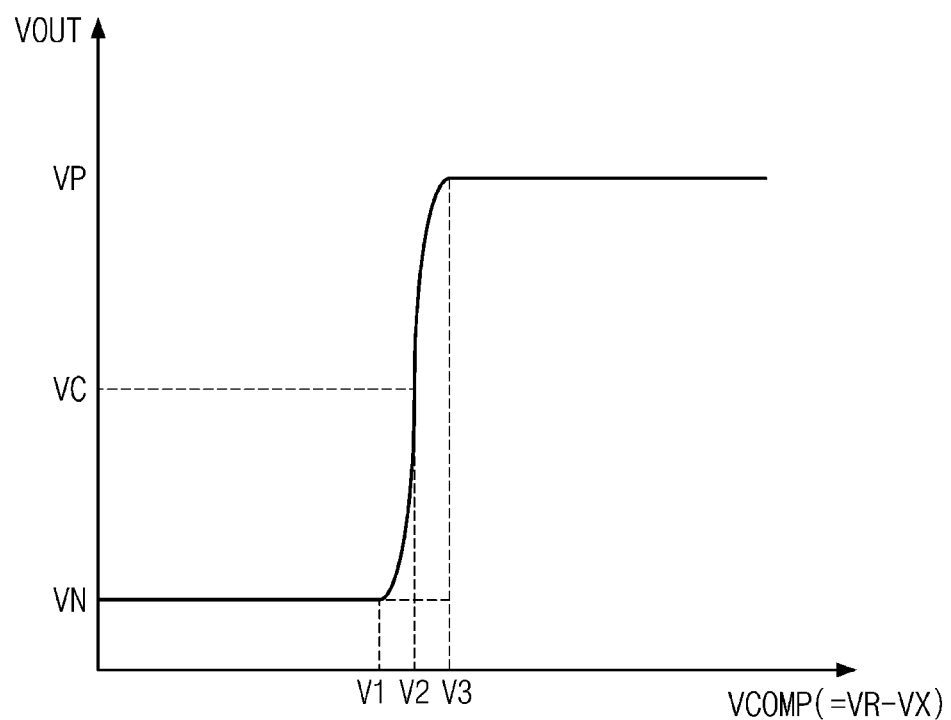
FIG. 11 is a graph illustrating a level of a voltage output from an electronic circuit according to an example embodiment.

FIG. 11 is a graph illustrating a level of a voltage output from an electronic circuit according to an example embodiment. In the example of FIG. 11, an x-axis represents a value (hereinafter, for better understanding, referred to as a "level of a voltage VCOMP") obtained by subtracting a level of the voltage VX from a level of the voltage VR, and an y-axis represents a level of the voltage VOUT.

When the level of the voltage VCOMP is smaller than "V1", the level of the voltage VOUT may be "VN". When the level of the voltage VCOMP is greater than "V3", the level of the voltage VOUT may be "VP". When the level of the voltage VCOMP increases from "V1" to "V3", the level of the voltage VOUT may sharply increase. When the level of the voltage VCOMP is "V2", the level of the voltage VOUT may be "VC". For example, when "V2" is "0" (i.e., when the levels of the voltages VR and VX are substantially the same), "VC" may be "0".

As described below with reference to FIG. 13, in another electronic circuit (e.g., a counter circuit) to be connected with the electronic circuit 200, each of the levels "VP" and "VN" of the voltage VOUT may be used to indicate a certain logical value. For example, the voltage VOUT of "VP" may correspond to logical high, and the voltage VOUT of "VN" may correspond to logical low.

When the level of the voltage VCOMP is "V1" or smaller (i.e., when the level of the voltage VX is greater than the level of the voltage VR), the electronic circuit 200 may output the voltage VOUT of "VN" corresponding to logical low; when the level of the voltage VCOMP is "V3" or greater (i.e., when the level of the voltage VX is smaller than the level of the voltage VR), the electronic circuit 200 may output the voltage VOUT of "VP" corresponding to logical high.

For better understanding, an example is illustrated in FIG. 11 as the level of the voltage VOUT is uniform regardless of the voltage VCOMP when the level of the voltage VCOMP is smaller than "V1" or is greater than "V3", but it may be understood that the level of the voltage VOUT changes substantially finely as the level of the voltage VCOMP changes.

Figure 12:
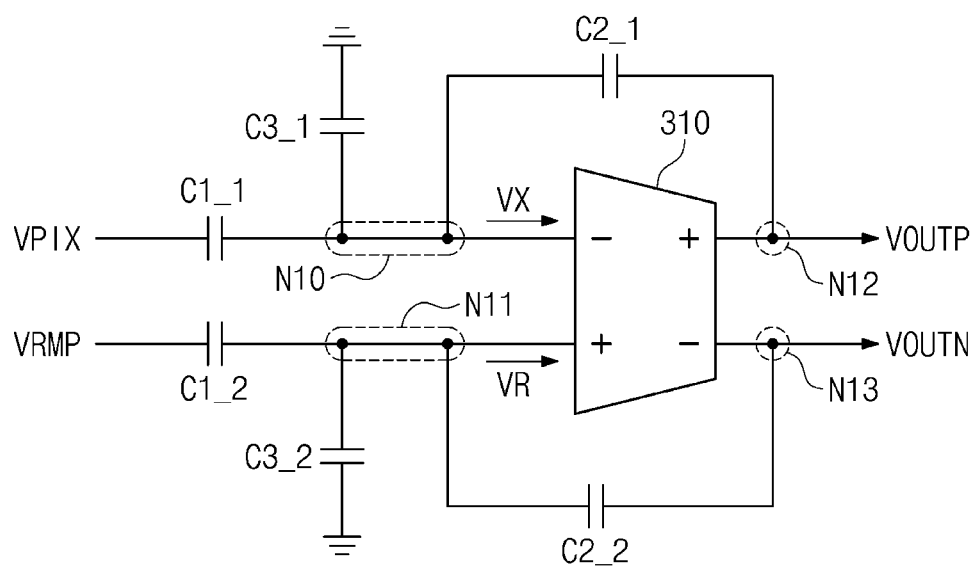
FIG. 12 is a circuit diagram illustrating an electronic circuit according to an example embodiment.

FIG. 12 is a circuit diagram illustrating an electronic circuit according to an example embodiment.

Referring to FIG. 12, an electronic circuit 300 may include capacitive elements C1_1, C1_2, C2_1, C2_2, C3_1 and C3_2, and OTA circuit 310. The OTA circuit 310 of FIG. 12 may include the electronic circuit 100 of FIG. 1 or the electronic circuit 200 of FIG. 6.

The electronic circuit 300 may be configured to have a symmetrical structure. For example, capacitances of the capacitive elements C1_1 and C1_2 may be "C1", capacitances of the capacitive elements C2_1 and C2_2 may be "C2", and capacitances of the capacitive elements C3_1 and C3_2 may be "C3".

The electronic circuit 300 may be a component of an electronic device. For example, the electronic circuit 300 may be a component of an image sensor (refer to FIG. 13). The electronic circuit 300 may receive voltages VPIX and VRMP targeted for comparison. Although not illustrated in FIG. 12, the voltages VPIX and VRMP may be sampled at an appropriate frequency for operations of the electronic circuit 300. For example, when the electronic circuit 300 is a component of an image sensor, the voltage VPIX may indicate a pixel value, and the voltage VRMP may be a ramp voltage.

The voltage VPIX may be received through the capacitive element C1_1. The capacitive element C1_1 may be connected with a node N10. The capacitive element C3_1 may be connected between the node N10 and the ground terminal. The capacitive element C2_1 may be connected between the node N10 and a node N12. The voltage VRMP may be received through the capacitive element C1_2. The capacitive element C1_2 may be connected with a node N11. The capacitive element C3_2 may be connected between the node N11 and the ground terminal. The capacitive element C2_2 may be connected between the node N11 and a node N13.

The voltage VX may be generated at the node N10 based on the voltage VPIX. The voltage VR may be generated at the node N11 based on the voltage VRMP. The OTA circuit 310 may receive the voltage VX of the node N10 through an inverting terminal and may receive the voltage VR of the node N11 through a non-inverting terminal.

The OTA circuit 310 may output voltages VOUTP and VOUTN based on the voltages VX and VR. For example, when the OTA circuit 310 includes the electronic circuit 100 of FIG. 1 or the electronic circuit 200 of FIG. 6, the voltage VOUT of FIG. 1 or 6 may correspond to one of the voltages VOUTP and VOUTN of FIG. 12.

As described with reference to FIG. 11, each of the voltages VOUTP and VOUTN may indicate a logical value. Logical values of the voltages VOUTP and VOUTN may be complementary. For example, when the voltage VOUTP indicates logical high, the voltage VOUTN may indicate logical low. For example, when the voltage VOUTP indicates logical low, the voltage VOUTN may indicate logical high.

For example, when the level of the voltage VPIX is greater than the level of the voltage VRMP, the level of the voltage VX generated based on the voltage VPIX may be greater than the level of the voltage VR generated based on the voltage VRMP. In this case, the OTA circuit 310 may output the voltage VOUTP of "VN" corresponding to logical low and the voltage VOUTN of "VP" corresponding to logical high.

For example, when the level of the voltage VPIX is smaller than the level of the voltage VRMP, the level of the voltage VX generated based on the voltage VPIX may be smaller than the level of the voltage VR generated based on the voltage VRMP. In this case, the OTA circuit 310 may output the voltage VOUTP of "VP" corresponding to logical high and the voltage VOUTN of "VN" corresponding to logical low.

As described with reference to FIGS. 1 to 11, the OTA circuit 310 may include transistors. A noise may be generated by the transistors included in the OTA circuit 310. For example, a thermal noise may be generated by the transistors of the OTA circuit 310. A magnitude of the noise "VNS" generated by the OTA circuit 310 may comply with a relationship of Equation 2 below.

$$VNS^2 \propto \left(\frac{1}{gmi} + \frac{gml}{gmi^2}\right)\left(1 + \frac{C2 + C3}{C1}\right)^2 \quad \text{[Equation 2]}$$

For example, the OTA circuit 310 may include the electronic circuit 100_1 (being an example of the electronic circuit 100). In this example, "gmi" represents a transconductance of the input circuit 120, and "gml" represents a transconductance of the load circuit 110. Because the voltages VR and VX are respectively received through the transistors MI1 and MI2, "gmi" of Equation 2 may be a transconductance "gmi1" of the transistors MI1 and MI2, and "gml" of Equation 2 may be a transconductance "gmi1" of the transistors ML1 and ML2 respectively connected with the transistors MI1 and MI2.

For example, the OTA circuit 310 may include the electronic circuit 200_1 (being an example of the electronic circuit 200). In this example, "gmi" represents a transconductance of the input circuit 220, and "gml" represents a transconductance of the load circuit 210. The voltages VR and VX may be respectively received through the transistors MI5 and MI7 connected in parallel and the transistors MI6 and MI8 connected in parallel.

Accordingly, "gmi" of Equation 2 may be a sum "gmi2+gmi3" of a transconductance "gmi2" of the transistors MI5 and MI6 and a transconductance "gmi3" of the transistors MI7 and MI8. Also, "gml" of Equation 2 may be a transconductance "gml2" of the transistors ML5 and ML6 respectively connected with the transistors MI5 and MI7 and with the transistors MI6 and MI8.

When the OTA circuit 310 includes the electronic circuit 100_1 of FIG. 2, a noise "VNS" may correspond to Equation 3 below.

$$\left(\frac{1}{gmil} + \frac{gml1}{gmil^2}\right) \quad [\text{Equation 3}]$$

When the OTA circuit 310 includes the electronic circuit 200 of FIG. 6, a noise "VNS" may correspond to Equation 4 below.

$$\left(\frac{1}{gmi2 + gmi3} + \frac{gml2}{(gmi2 + gmi3)^2}\right) \quad [\text{Equation 4}]$$

Because the electronic circuit 200_1 receives the voltage VR or VX through two transistors MI5 and MI7 or MI6 and MI8 connected in parallel, the electronic circuit 200_1 may have a relatively great "gmi" value. For example, "gmi2+gmi3" of the electronic circuit 200 may be greater than "gmi1" of the electronic circuit 100.

A sum of levels of the currents IDL5 and IDL6 and levels of the currents IDI7 and IDI8 may be maintained at a value corresponding to "IB1" through the current source circuit IB1. Accordingly, levels of the currents IDL5 and IDL6 flowing through the transistors ML5 and ML6 of the load circuit 210_1 may decrease, by the currents IDI7 and IDI8 flowing through the two transistors MI7 and MI8.

When the levels of the currents IDL5 and IDL6 are small, because transconductances of the transistors ML5 and ML6 decrease, the electronic circuit 200_1 may have a relatively small "gml" value. For example, the transconductance "gml2" of the transistors ML5 and ML6 of FIG. 7 may be smaller than the transconductance "gml1" of the transistors ML1 and ML2 of FIG. 2.

In the Equation 2, as "gmi" becomes greater and "gml" becomes smaller, a value of the Equation 3 may become smaller. Because "gmi=gmi2+gmi3" of the electronic circuit 200_1 is greater than "gmi=gmi1" of the electronic circuit 100_1 and "gml=gml2" of the electronic circuit 200_1 is smaller than "gml=gml1" of the electronic circuit 100_1, a value of the Equation 4 of the electronic circuit 200_1 may be smaller than a value of the Equation 3 of the electronic circuit 100.

Accordingly, a noise generated by the OTA circuit 310 including the electronic circuit 200 may be lower than a noise generated by the OTA circuit 310 including the electronic circuit 100. The electronic circuit 300 designed by using the electronic circuit 200 may output the voltages VOUTP and VOUTN including a low noise.

Figure 13:
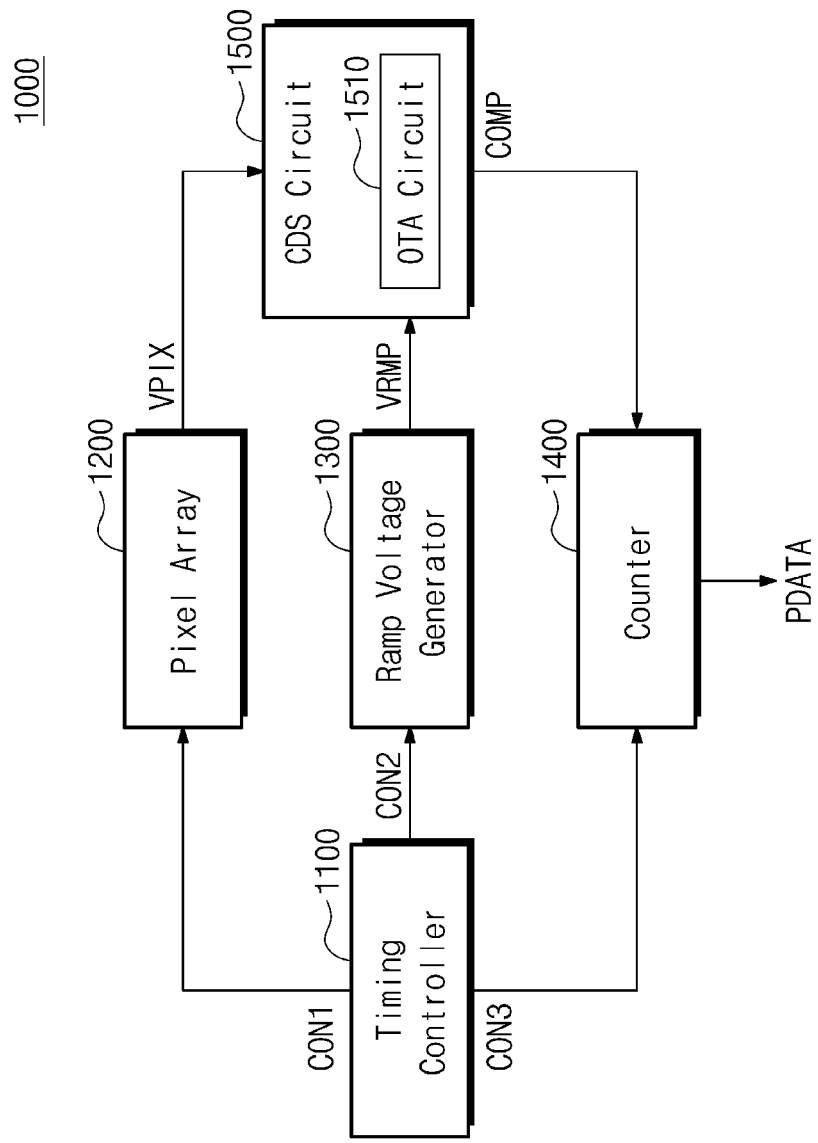
FIG. 13 is a block diagram illustrating an image sensor according to an example embodiment.

FIG. 13 is a block diagram illustrating an image sensor according to an example embodiment. The image sensor may include the electronic circuit of FIG. 6.

Referring to FIG. 13, an image sensor 1000 may include a timing controller 1100, a pixel array 1200, a ramp voltage generator 1300, a counter 1400, and a correlated double sampling (CDS) circuit 1500. The CDS circuit 1500 may include an OTA circuit 1510.

The timing controller 1100 may receive a control signal from another electronic device (e.g., a processor) for controlling the image sensor 1000 and may generate signals CON1 to CON3 for controlling the pixel array 1200, the ramp voltage generator 1300, and the counter 1400 in response to the control signal.

The pixel array 1200 may include a plurality of pixels for sensing a light that is incident on the pixels and received from the outside of the image sensor 1000. For example, each of the pixels of the pixel array 1200 may include a photosensitive element for sensing a light incident thereon. The pixel array 1200 may generate the voltage VPIX indicating the intensity of the sensed light. The pixel array 1200 may output the voltage VPIX to the CDS circuit 1500 in response to the signal CON1. For example, the pixel array 1200 may output the voltage VPIX under control of a row driver that operates in response to the signal CON1.

The ramp voltage generator 1300 may generate the voltage VRMP in response to the signal CON2. A level of the voltage VRMP may increase or decrease over time. For example, the ramp voltage generator 1300 may be configured to generate the voltage VRMP having a level that increases or decreases over time. For example, the level of the voltage VRMP may increase/decrease based on a reference ratio over time.

The CDS circuit 1500 may receive the voltage VRMP from the ramp voltage generator 1300 and may receive the voltage VPIX from the pixel array 1200. The CDS circuit 1500 may include the OTA circuit 1510 for comparing a level of the voltage VRMP and a level of the voltage VPIX. For example, the OTA circuit 1510 may include the electronic circuit 300 of FIG. 12 (including the electronic circuit 200 of FIG. 6).

As described with reference to FIGS. 11 and 12, the OTA circuit 1510 may output the voltages VOUTP and VOUTN indicating a result of comparing the level of the voltage VRMP and the level of the voltage VPIX. The CDS circuit 1500 may output a signal COMP for transferring the comparison result indicated by the voltages VOUTP and VOUTN. For example, the signals VOUTP and VOUTN may indicate complementary logical values, respectively. Accordingly, the signal COMP may indicate a certain logical value based on at least one of the voltages VOUTP and VOUTN.

The counter 1400 may start a counting operation in response to the signal CON3. For example, in response to the signal CON3, the counter 1400 may obtain a first time at which a level of the voltage VRMP starts to decrease from a reference level. The counter 1400 may perform a counting operation during a time period from the first time to a second time indicated by the signal COMP. For example, the counter 1400 may count pulses included in a clock that is generated by a clock generator. For example, the counter 1400 may perform a counting operation in response to a certain logical value (e.g., logical high or logical low) of the signal COMP.

The number of pulses thus counted may correspond to digital data indicating the level of the voltage VPIX. The counter 1400 may output data PDATA indicating a value corresponding to the number of pulses thus counted. For example, the counter 1400 may output the signal PDATA to any other component of an electronic device (refer to FIG. 14) including the image sensor 1000.

Figure 14:
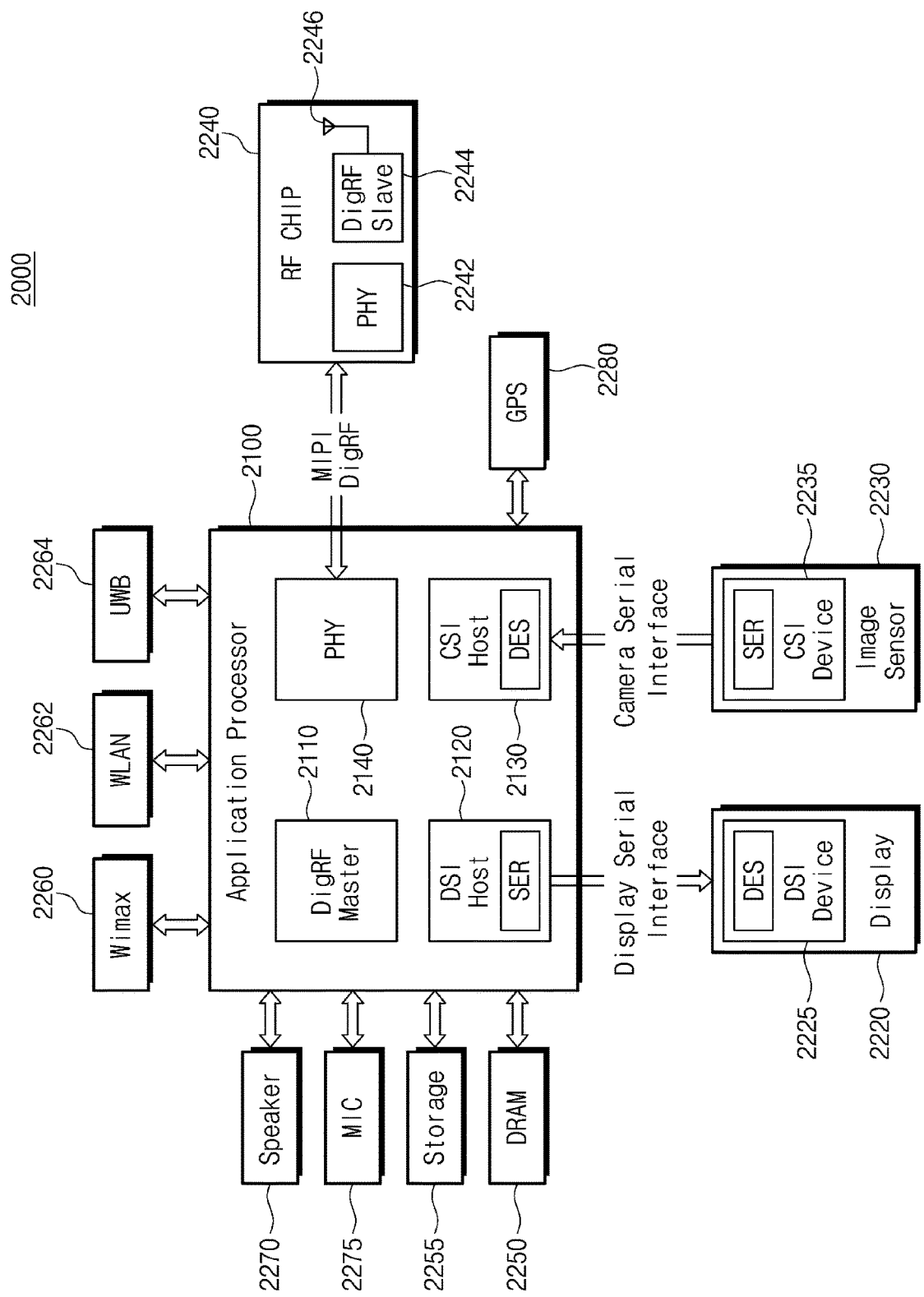
FIG. 14 is a block diagram illustrating an electronic device according to an example embodiment.

FIG. 14 is a block diagram illustrating an electronic device according to an example embodiment.

An electronic device 2000 may be implemented with a data processing device that is able to use or support an interface protocol proposed by the MIPI alliance. For example, the electronic device 2000 may be one of electronic devices such as a portable communication terminal, a personal digital assistant (PDA), a portable media player (PMP), a smartphone, a tablet computer, and a wearable device.

The electronic device 2000 may include an application processor 2100, a display 2220, and an image sensor 2230. The application processor 2100 may include a DigRF master 2110, a display serial interface (DSI) host 2120, a camera serial interface (CSI) host 2130, and a physical layer 2140.

For example, the application processor 2100 may generate a control signal for controlling the image sensor 1000 of FIG. 13 including the electronic circuit 200 of FIG. 6. The application processor 2100 may control the timing controller 1100 of the image sensor 1000 based on the control signal.

The DSI host 2120 may communicate with a DSI device 2225 of the display 2220 through the DSI. For example, a serializer SER may be implemented in the DSI host 2120. For example, a deserializer DES may be implemented in the DSI device 2225.

The CSI host 2130 may communicate with a CSI device 2235 of the image sensor 2230 through the CSI. For example, a deserializer DES may be implemented in the CSI host 2130, and a serializer SER may be implemented in the CSI device 2235.

The image sensor 2230 may include the image sensor 1000 of FIG. 13. The image sensor 2230 may generate a ramp voltage for the purpose of obtaining image data associated with an image outside the electronic device 2000. The image sensor 2230 may generate a pixel voltage based on a light received from the outside of the electronic device 2000. The image sensor 2230 may include an OTA circuit for comparing a level of a ramp voltage and a level of a pixel voltage. For example, the OTA circuit may include the OTA circuit 310 of FIG. 12 including the electronic circuit 200 of FIG. 6. Accordingly, the OTA circuit may output a voltage including a low noise.

The image sensor 2230 may obtain image data based on the result of comparing the level of the ramp voltage and the level of the pixel voltage. The image sensor 2230 may output the image data to the application processor 2100 through the CSI.

The display 2220 may include the DSI device 2225. For example, the display 2220 may provide information of an image based on the image data output from the image sensor 2230.

The electronic device 2000 may further include a radio frequency (RF) chip 2240 that communicates with the application processor 2100. The RF chip 2240 may include a physical layer 2242, a DigRF slave 2244, and an antenna 2246. For example, the physical layer 2242 of the RF chip 2240 and the physical layer 2140 of the application processor 2100 may exchange data with each other through a DigRF interface proposed by the MIPI alliance.

The electronic device 2000 may further include a dynamic random access memory (DRAM) 2250 and storage 2255. The DRAM 2250 and the storage 2255 may store data received from the application processor 2100. Also, the DRAM 2250 and the storage 2255 may provide the stored data to the application processor 2100. The DRAM 2250 and the storage 2255 may store information about signals received from the image sensor 1000 of FIG. 13.

The electronic device 2000 may communicate with an external device/system through communication modules, such as a worldwide interoperability for microwave access (WiMAX) 2260, a wireless local area network (WLAN) 2262, and an ultra-wideband (UWB) 2264. The electronic device 2000 may further include a speaker 2270 and a microphone 2275, which are used to process voice information. The electronic device 2000 may further include a global positioning system (GPS) device 2280 for processing position information.

According to an example embodiment of the inventive concepts, a noise included in a voltage output from an amplifying circuit may decrease, and an image sensor may operate based on a voltage including a low noise.

While example embodiments have been described, it will be apparent to those of ordinary skill in the art that various changes and modifications may be made thereto without departing from the spirit and scope of the inventive concepts as set forth in the following claims.

What is claimed is:

1. An electronic circuit comprising:
    a first current generating circuit configured to output a first operating current based on a first operating voltage, the first current generating circuit including a current source circuit configured to maintain the first operating current at a predetermined level; and
    a first capacitor and a second capacitor;
    an input circuit configured to:
        receive a first current corresponding to a first input voltage at a first input node and a second current corresponding to a second input voltage at a second input node, wherein the first current and the second current are based on the first operating current;
        receive a third current and a fourth current that are generated based on the first operating voltage; and
        generate a fifth current corresponding to the second input voltage based on a second operating current,
    wherein the electronic circuit is configured to generate a first output voltage at a first output node and a second output voltage at a second output node, wherein the first output voltage and the second output voltage are associated with a difference between the first input voltage and the second input voltage based on the second current, the fourth current and the fifth current,
    wherein the fourth current corresponds to the third current, and
    wherein a first node of the first capacitor is connected to the first input node, a second node of the first capacitor is connected to the first output node, a first node of the second capacitor is connected to the second input node and a second node of the second capacitor is connected to the second output node.

2. The electronic circuit of claim 1, wherein the first current generating circuit is configured to maintain the first operating current, and
    wherein the first operating current corresponds to a sum of the first current and the second current.

3. The electronic circuit of claim 1, wherein the input circuit is further configured to generate a sixth current corresponding to the first input voltage based on the second operating current.

4. The electronic circuit of claim 3, further comprising a second current generating circuit configured to output the second operating current based on a second operating voltage,
wherein the second current corresponds to a sum of the fifth current and the sixth current.

5. The electronic circuit of claim 4, wherein the first operating current is 0.7 to 0.9 times the second operating current.

6. The electronic circuit of claim 5, wherein the second operating voltage is a ground voltage.

7. The electronic circuit of claim 1, wherein the output voltage is further associated with a difference between a sum of the second current and the fourth current, and the fifth current.

8. The electronic circuit of claim 1, further comprising a load circuit configured to output the third current and the fourth current based on the first operating voltage.

9. The electronic circuit of claim 1, wherein the first input voltage is a ramp voltage and the second input voltage is a pixel voltage.

10. The electronic circuit of claim 1, wherein the first capacitor has a first capacitance and the second capacitor has a second capacitance that is equal to the first capacitance.

11. The electronic circuit of claim 1, wherein the first output voltage and the second output voltage are complementary.

12. An electronic circuit comprising:
a first capacitor and a second capacitor;
a first current generating circuit configured to output a first operating current based on an operating voltage, the first current generating circuit including a current source circuit configured to maintain the first operating current at a predetermined level, the first operating current including a first current and a second current;
a load circuit configured to output a third current and a fourth current that corresponds to the third current based on the operating voltage; and
an input circuit configured to:
based on a first input voltage at a first input node, conduct the first current and a fifth current that includes the first current and the third current; and
based on a second input voltage at a second input node, conduct the second current and output a sixth current,
wherein the electronic circuit is configured to generate a first output voltage at a first output node and a second output voltage at a second output node, wherein the first output voltage and the second output voltage are associated with a difference between the first input voltage and the second input voltage based on the second current, the fourth current and the sixth current, and
wherein a first node of the first capacitor is connected to the first input node, a second node of the first capacitor is connected to the first output node, a first node of the second capacitor is connected to the second input node and a second node of the second capacitor is connected to the second output node.

13. The electronic circuit of claim 12, further comprising a second current generating circuit configured to output a second operating current that includes the fifth current and the sixth current.

14. The electronic circuit of claim 13, wherein the second operating current corresponds to a sum of the fifth current and the sixth current.

15. The electronic circuit of claim 13, wherein the first operating current is 0.7 to 0.9 times the second operating current.

16. The electronic circuit of claim 12, wherein the output voltage corresponds to a difference between a sum of the second current and the fourth current, and the sixth current.

17. An electronic circuit comprising:
a first capacitor and a second capacitor;
a first transistor configured to conduct a first current generated based on an operating voltage and a first input voltage at a first input node;
a second transistor configured to conduct a second current generated based on the operating voltage and a second input voltage at a second input node;
a third transistor configured to conduct the first current and a third current generated based on the operating voltage and the first input voltage;
a fourth transistor configured to conduct a fourth current based on the second input voltage; and
a fifth transistor configured to output a first operating current including the first current and the second current,
wherein the first operating current is maintained at a predetermined level,
wherein the electronic circuit is configured to generate a fifth current that corresponds to the third current, and generate a first output voltage at a first output node and a second output voltage at a second output node, wherein the first output voltage and the second output voltage are associated with a difference between the first input voltage and the second input voltage based on the fifth current, the second current and the fourth current, and
wherein a first node of the first capacitor is connected to the first input node, a second node of the first capacitor is connected to the first output node, a first node of the second capacitor is connected to the second input node and a second node of the second capacitor is connected to the second output node.

18. The electronic circuit of claim 17, further comprising a sixth transistor configured to output a second operating current including the first current, the third current and the fourth current.

19. The electronic circuit of claim 17, wherein the first current and the third current are associated with the first input voltage, and
wherein the second current and the fourth current are associated with the second input voltage.

20. The electronic circuit of claim 17, wherein a noise included in the output voltage is associated with a sum of a first transconductance of the first transistor and a third transconductance of the third transistor or a sum of a second transconductance of the second transistor and a fourth transconductance of the fourth transistor.

* * * * *